(12) United States Patent
Kamiyama et al.

(10) Patent No.: US 7,880,788 B2
(45) Date of Patent: Feb. 1, 2011

(54) OPTICAL SENSOR CIRCUIT AND IMAGE SENSOR

(75) Inventors: Tomoyuki Kamiyama, Tochigi (JP); Sukeyuki Shinotsuka, Tochigi (JP); Masaki Kunigami, Tochigi (JP); Makoto Furukawa, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 587 days.

(21) Appl. No.: 11/719,802

(22) PCT Filed: Jun. 9, 2006

(86) PCT No.: PCT/JP2006/311632

§ 371 (c)(1),
(2), (4) Date: May 21, 2007

(87) PCT Pub. No.: WO2006/132366

PCT Pub. Date: Dec. 14, 2006

(65) Prior Publication Data

US 2009/0147119 A1    Jun. 11, 2009

(30) Foreign Application Priority Data

Jun. 10, 2005    (JP)    ................ 2005-170936

(51) Int. Cl.
*H04N 3/14*    (2006.01)
*H04N 5/335*    (2006.01)
*H01L 27/00*    (2006.01)

(52) U.S. Cl. .............. 348/308; 348/302; 250/208.1
(58) Field of Classification Search ......... 348/302–308; 250/208.1, 214 A
See application file for complete search history.

(56) References Cited

U.S. PATENT DOCUMENTS

| 6,046,444 | A  | * | 4/2000 | Afghahi ................ 250/208.1 |
| 6,191,408 | B1 | * | 2/2001 | Shinotsuka et al. ...... 250/208.1 |
| 6,911,640 | B1 | * | 6/2005 | Bencuya et al. ......... 250/208.1 |
| 7,349,018 | B2 | * | 3/2008 | Doering et al. ............ 348/308 |
| 7,525,579 | B2 | * | 4/2009 | Katagiri ..................... 348/234 |
| 2005/0083422 | A1 | * | 4/2005 | Lee et al. .................... 348/308 |
| 2006/0158529 | A1 | * | 7/2006 | Katagiri ................. 348/222.1 |
| 2007/0126903 | A1 | * | 6/2007 | Kamiyama ................ 348/308 |

FOREIGN PATENT DOCUMENTS

| JP | 11-298799    | 10/1999 |
| JP | 2001-145024  | 5/2001  |
| JP | 2000-329616  | 11/2001 |
| JP | 2002-77733   | 3/2002  |
| JP | 2002-223392  | 8/2002  |

* cited by examiner

*Primary Examiner* — Sinh Tran
*Assistant Examiner* — Christopher K Peterson
(74) *Attorney, Agent, or Firm* — Rankin, Hill & Clark LLP

(57) ABSTRACT

An optical sensor circuit has a photodiode PD, a MOS transistor Q1, a voltage controller 13 which supplies a gate voltage and a drain voltage to the transistor, etc. The voltage controller includes initial setting means 15. In the initial setting means, an electrostatic capacitance element of the photodiode is charged/discharged while setting a gate voltage of the transistor Q1 to a high gate voltage value VgH, only for a predetermined time period, and setting a drain voltage to a low drain voltage value VdL, only for a predetermined time period. Thereafter, the drain voltage is set to VdH, and, after elapse of a predetermined time period, the gate voltage is set to VgL. VgH, VdH, and VdL satisfy relational expressions of "VgH−VdH<Vth and VgH−VdL>Vth where Vth: a threshold voltage of the MOS transistor Q1".

9 Claims, 25 Drawing Sheets

RELATIONSHIPS AMONG GATE VOLTAGE (VgH) AND THRESHOLD VOLTAGE (Vth) OF MOS TRANSISTOR Q1, AND TERMINAL VOLTAGE (VC1) OF PHOTODIODE

RELATIONSHIPS AMONG GATE VOLTAGE (VgH) AND THRESHOLD VOLTAGE (Vth)
OF MOS TRANSISTOR Q1, AND TERMINAL VOLTAGE (VC1) OF PHOTODIODE

RELATIONSHIPS AMONG GATE VOLTAGE (VgH) AND THRESHOLD VOLTAGE (Vth)
OF MOS TRANSISTOR Q1, AND TERMINAL VOLTAGE (VC1) OF PHOTODIODE,
AND RANGE OF LINEAR OUTPUT CHARACTERISTIC

RELATIONSHIPS AMONG GATE VOLTAGE (VgH) AND THRESHOLD VOLTAGE (Vth) OF MOS TRANSISTOR Q1, AND TERMINAL VOLTAGE (VC1) OF PHOTODIODE

RELATIONSHIPS AMONG GATE VOLTAGE (VgH) AND THRESHOLD VOLTAGE (Vth)
OF MOS TRANSISTOR Q1, AND TERMINAL VOLTAGE (VC1) OF PHOTODIODE

RELATIONSHIPS AMONG GATE VOLTAGE (VgH) AND THRESHOLD VOLTAGE (Vth)
OF MOS TRANSISTOR Q1, AND TERMINAL VOLTAGE (VC1) OF PHOTODIODE

SET POTENTIAL DIFFERENCE (ΔVg) BETWEEN HIGH VOLTAGE (VgH) AND
LOW VOLTAGE (VgL) IN GATE VOLTAGE (Vg) OF MOS TRANSISTOR Q1

OPTICAL SENSOR CIRCUIT AND IMAGE SENSOR

TECHNICAL FIELD

The present invention relates to an optical sensor circuit and an image sensor, and more particularly to an optical sensor circuit that is suitable for realizing a MOS image sensor which has linear and logarithmic output characteristics according to the illuminance of incident light, and in which the dynamic range is wide, and an image sensor which is produced by using the optical sensor circuit as one pixel.

BACKGROUND ART

Kinds of optical sensor circuits which form pixels of a MOS image sensor are classified into three circuits. The first optical sensor circuit is an optical sensor circuit having a linear output characteristic with respect to a change in the illuminance (intensity) of incident light, the second optical sensor circuit is an optical sensor circuit having a logarithmic output characteristic with respect to a change in the illuminance of incident light, and the third optical sensor circuit is an optical sensor circuit having a linear output characteristic with respect to incident light with low illuminance, and a logarithmic output characteristic with respect to incident light with high illuminance. Hereinafter, these optical sensor circuits will be briefly described, and their characteristics will be evaluated in S/N ratio, dynamic range, residual image, sensitivity at low illuminance, etc.

FIG. 21 shows an example of an optical sensor circuit having a linear output characteristic. The optical sensor circuit 101 comprises a photodiode PD serving as an optical sensor device which detects incident light (light signal) L1 and converts it to an electric signal. The photodiode PD has a capacitor C1 which is a parasitic capacity (including stray capacitance of wirings). The optical sensor circuit 101 further comprises a MOS transistor Q1 which charges and discharges the capacitor C1, a MOS transistor Q2 for amplifying the terminal voltage of the capacitor C1, and a MOS transistor Q3 which selectively outputs the amplified terminal voltage (Vout) as a pixel signal. Hereinafter, the MOS transistor Q1 is referred to as "first MOS transistor Q1", the MOS transistor Q2 is referred to as "second MOS transistor Q2", and the MOS transistor Q3 is referred to as "third MOS transistor Q3". A resistor R is connected to the drain terminal of the third MOS transistor Q3.

Required voltages V1, V2 are applied by a voltage controller 102 to the gate terminal G1 and drain terminal D1 of the first MOS transistor Q1. Similarly, required voltages V3, V4 are applied by the voltage controller 102 and the like (pixel selecting circuit and the like) to the gate terminal G3 of the third MOS transistor Q3 and an outer terminal T1 of the resistor R. The generation timings of the required voltages V1 to V4 output from the voltage controller 102 are instructed by a timing signal generating portion 103.

The operation of the optical sensor circuit 101 will be described. In a state where the drain voltage V2 of the first MOS transistor Q1 is maintained to a high level, the gate voltage V1 of the first MOS transistor Q1 is set to a high level at a timing of initialization. This eliminates charges remaining in the capacitor C1 of the photodiode PD to the drain of the first MOS transistor Q1. Then, the gate voltage V1 is switched to a low level (0 V) to turn off the first MOS transistor Q1. Thereafter, the capacitor C1 of the photodiode PD is caused to accumulate charges. The terminal voltage of the capacitor C1 which is produced by the accumulation of charges is applied to the gate of the second MOS transistor Q2. When, after elapse of a constant exposure time in the photodiode PD, the light signal is output as the voltage Vout from the drain of the third MOS transistor Q3.

In the optical sensor circuit 101, the photocurrent flowing through the photodiode PD is dominated by a discharge current of charges charged in the capacitor C1 of the photodiode PD. Therefore, the output voltage Vout which is a sensor output of the optical sensor circuit 101 shows the linear output characteristic which is proportional to the discharge current. The optical sensor circuit 101 can control the sensor output on the basis of the exposure time, and hence becomes a storage type image sensor. In the circuit configuration of the optical sensor circuit 101, however, the output voltage Vout is proportional to the intensity of the incident light L1, and, when strong light is incident, the circuit saturates. Therefore, the circuit has a problem in that the dynamic range cannot be largely widened.

An optical sensor circuit having a circuit configuration which is similar to the optical sensor circuit 101 is shown in FIG. 7 and the like of Patent Reference 1.

Next, FIG. 22 shows an example of an optical sensor circuit having a logarithmic output characteristic. In FIG. 22, components which are substantially identical with those illustrated with reference to FIG. 21 are denoted by the same reference numerals, and duplicated detailed description of the components is omitted. In the optical sensor circuit 201, a MOS transistor Q21 is used in place of the first MOS transistor Q1 of the optical sensor circuit 101. In the MOS transistor Q21, the gate is electrically connected to the drain. The MOS transistor Q21 corresponds to the first MOS transistor Q1 to be used in place of it, and hence is referred to as "first MOS transistor Q21". The photodiode PD, the capacitor C1, the second MOS transistor Q2, the third MOS transistor Q3, the resistor R, and the other circuit configuration are identical with those illustrated with reference to FIG. 21. In the optical sensor circuit 201, the first MOS transistor Q21 converts the sensor current of the photodiode PD to a sensor voltage having a logarithmic characteristic in a weak inversion state.

In the optical sensor circuit 201, the gate of the first MOS transistor Q21 is connected to the drain of the transistor, the drain and gate voltages are set to the same constant drain voltage V2, and the third MOS transistor Q3 is turned on to output the light signal as the output voltage Vout. A high-level gate voltage from the voltage controller 102 is supplied to the gate terminal G3 of the third MOS transistor Q3.

In the optical sensor circuit 201, the dynamic range can be widened in order to use the logarithmic output characteristic. However, the photocurrent flows via the channel of the first MOS transistor Q21, and hence the S/N ratio cannot be improved by lengthening the exposure time unlike a storage type image sensor. Therefore, the sensitivity for low illuminance is lower than that of a storage type image sensor based on the optical sensor circuit 101. When the current flowing through the first MOS transistor Q21 is small, the impedance of the channel is high, and hence there arises a problem in that a residual image easily occurs.

An optical sensor circuit having a logarithmic output characteristic is disclosed in Patent Reference 1.

FIG. 23 shows an example of an optical sensor circuit having a linear output characteristic with respect to the incident light L1 with low illuminance, and a logarithmic output characteristic with respect to incident light with high illuminance. The circuit configuration of the optical sensor circuit 301 shown in FIG. 23 is identical with that of the optical sensor circuit 101, components which are identical with those illustrated in FIG. 21 are denoted by the same reference numerals, and their description is omitted. The gate voltage Vg is supplied to the gate of the first MOS transistor Q1, and the drain voltage Vd is supplied to the drain of the transistor. FIG. 24 shows voltage waveforms of the supplied gate and drain voltage Vg and Vd. In the optical sensor circuit 301, the drain voltage Vd of the first MOS transistor Q1 is set to a predetermined value (Vd1), and the gate voltage Vg is set to a voltage (Vg1: high level (H)) which is sufficiently higher than the drain voltage Vd, only for a predetermined time period (t2–t1), whereby the circuit is controlled so as to charge and discharge the capacitor C1 of the photodiode PD connected to the source. The control is executed by the voltage controller 102 and the timing signal generating portion 103. The functional portion which executes the control is called "initial setting means". The other configuration is identical with the optical sensor circuit 101 illustrated with reference to FIG. 21.

The operation of the optical sensor circuit 301 will be described with reference to the timing chart (voltage waveform chart) shown in FIG. 24. The drain voltage Vd is set to the constant voltage value (Vd1) by which, when the gate voltage Vg is at a low level (L), a current flowing through the first MOS transistor Q1 is converted to a voltage having a logarithmic output characteristic in a weak inversion state.

In the above-described state, the gate voltage Vg is set to a high voltage (Vg1: high level) during t1 to t2. As a result, the first MOS transistor Q1 is set to the on state, the channel impedance of the first MOS transistor Q1 is a low resistance, and the voltage of the source terminal, i.e., the terminal voltage VC1 of the capacitor C1 is charged to a value which is similar to the drain voltage Vd. Hereinafter, this operation is referred to as "reset operation".

Nest, at the timing of t2, the gate voltage Vg is switched to the low level. During t2 to t3, the photocurrent flowing through the photodiode PD is dominated by a discharge current of charges charged in the capacitor C1 of the photodiode PD. Therefore, the terminal voltage VC1 of the capacitor C1 is lowered during a time interval of t2 to t3 by the discharging of charges, and the sensor output shows a linear output which is proportional to the discharge current. During the time interval of t2 to t3, the output is a linear output region 302. When the terminal voltage VC1 of the capacitor C1 is further lowered by discharging of charges, after the timing of t3, the photocurrent flowing through the photodiode PD is dominated by the current supplied from the first MOS transistor Q1, and the sensor output is converted to a voltage having a logarithmic characteristic, and shows a logarithmic output. During the time interval of t3 to t4, the output is a logarithmic output region 303.

The optical sensor circuit 301 comprises: the linear output region 302 where, in the case where the photocurrent of the photodiode PD is weak, a voltage which is proportional to the discharge current of the capacitor C1 is detected; and the logarithmic output region 303 where, in the case where the photocurrent of the photodiode PD is large, a voltage having a logarithmic characteristic is detected. Therefore, the optical sensor circuit 301 can accurately detect weak light, and widen the dynamic range.

Furthermore, the optical sensor circuit 301 can average noises by means of an integral operation of the capacitor C1, and therefore the S/N ratio can be improved so that the lower limit of the detectable range of the light illuminance is further lowered, thereby enabling a high sensitivity to be realized. Accordingly, it is possible to realize an optical sensor circuit in which the S/N ratio is high, the sensitivity is high, and the dynamic range is wide.

However, the optical sensor circuit 301 has a problem in that, in the case where the circuit is configured as one pixel and such pixels are connected in a two-dimensional matrix pattern to form an imaging region and constitute a two-dimensional image sensor, a point of change between the region having a linear output characteristic and that having a logarithmic output characteristic is dispersed among pixels.

FIG. 25 is a characteristic diagram showing dispersion of the incident light intensity (abscissa) and the sensor output (ordinate) among pixels of a two-dimensional image sensor. In the figure, for example, a difference between the sensor output voltage at each incident light intensity and the output voltage in a dark state is plotted with respect to six pixels. The dispersion of the sensor output is caused by that of the threshold of the first MOS transistor Q1.

The cause of the dispersion will be described with reference to FIG. 26. In FIG. 26, two pixels A, B produced by the optical sensor circuit 301 are shown in the abscissa direction, and the potential state of the terminal voltage VC1 of the capacitor (parasitic capacity) C1 is shown in the direction of the ordinate. In the ordinate showing the terminal voltage VC1, the upper side corresponds to "dark", and the lower side to "bright". Immediately after the above-mentioned reset operation, the terminal voltage VC1 of the capacitor C1 of the photodiode PD is a potential equivalent to the drain voltage Vd in both the pixels A, B (state 310). Thereafter, the photocurrent flowing through the photodiode PD is dominated by a discharge current of charges charged in the capacitor C1 of the photodiode PD. Hence, the terminal voltage VC1 is lowered by discharging, and the sensor output shows a linear output characteristic (302A, 302B) which is proportional to the discharge current. When the terminal voltage VC1 is further lowered by discharging of charges, the current supplied from the first MOS transistor Q1 is dominant so that the sensor output shows a logarithmic output characteristic (303A, 303B).

The points of change between the regions (302A, 302B) showing a linear output and the regions (303A, 303B) showing a logarithmic output relate to the threshold (Vth) of the first MOS transistor Q1. When the threshold is dispersed as VthA, VthB, therefore, the potential of the point of change is different depending on pixels. In all the pixels, however, the terminal potentials immediately after the reset are the drain voltage Vd and common (state 310). Accordingly, the potential difference between the terminal potential immediately after the reset and the above-mentioned point of change (304A, 304B) is different between the pixels A, B. In this way, due to the phenomenon that the potential difference between the terminal potential immediately after the reset and the above-mentioned point of change is different between the pixels A, B, the region having a linear characteristic is dispersed among pixels.

Patent Reference 2 discloses an optical sensor signal processing apparatus which solves the problem in the optical sensor circuit 301. In the optical sensor signal processing apparatus, a fixed pattern noise due to dispersion of characteristics of pixels in a MOS image sensor is suppressed, and dispersion of output characteristics at an inflection point where the output of each pixel is switched from the linear characteristic region to the logarithmic characteristic region is corrected. Therefore, a table for correcting the output value is disposed for each pixel (optical sensor circuit), so that the output value of each pixel is corrected.

Patent Reference 1: JP-A-2000-329616

Patent Reference 2: JP-A-11-298799

DISCLOSURE OF THE INVENTION

Problems that the Invention is to Solve

In an optical sensor circuit having a linear output characteristic with respect to incident light with low illuminance, and a logarithmic output characteristic with respect to incident light with high illuminance, as described above, the potential of a point of change between a linear characteristic region and a logarithmic characteristic region depends on the threshold (Vth) of the first MOS transistor Q1 of each optical sensor circuit, and the terminal potentials immediately after the reset in optical sensor circuits are the drain voltage Vd and common. Therefore, dispersion occurs among optical sensor circuits, i.e., pixels. Accordingly, a solution is proposed by Patent Reference 2.

In the solution proposed by Patent Reference 2, however, each pixel must have a table for correcting the output value. According to the operating temperature, a characteristic change or a secular change is caused in a MOS transistor. As a result, the contents of the table which are set before shipment are gradually deviated from actual characteristics of pixels with elapse of time, and there arises a problem in that dispersion among pixels again occurs. Therefore, the solution proposed by Patent Reference 2 remains to be improved in the viewpoint of practicality.

In view of the above-discussed problems, it is an object of the invention to provide an optical sensor circuit which has linear and logarithmic output characteristics in accordance with the illuminance of incident light, and in which a point of change between linear and logarithmic characteristic regions can be controlled, dispersion of potentials of the points of change among optical sensor circuits is stably eliminated, the S/N ratio at low illuminance or the like is high, the sensitivity is high, the dynamic range is wide, and the level of a residual image is low, and an image sensor.

Means for Solving the Problems

In order to attain the object, the optical sensor circuit and image sensor of the invention are configured in the following manner.

A first optical sensor circuit (corresponding to claim 1) comprises: a photoelectrical converting device (photodiode PD, or the like) which includes an electrostatic capacitance element (capacitor C1) that stores charges, and which converts a light signal to a current signal; a converting MOS transistor (Q1) for converting the current signal output from the photoelectrical converting device to a voltage signal having a logarithmic characteristic in a weak inversion state; and controlling means (voltage controller 13 and timing signal generating portion 14) for supplying a gate voltage to a gate of the MOS transistor (Q1), and supplying a drain voltage to a drain, and the controlling means comprises following initial setting means (15). The initial setting means (15) has functions of: charging/discharging the electrostatic capacitance element of the photoelectrical converting device while setting the gate voltage of the converting MOS transistor (Q1) to a high gate voltage value (VgH), only for a first predetermined time period, and setting the drain voltage to a low drain voltage value (VdL), only for a second predetermined time period; thereafter setting the drain voltage to a high drain voltage value (VdH); and, after elapse of a third predetermined time period, setting the gate voltage to a low gate voltage value (VgL). In the above, the initial setting means (15) sets so that the high gate voltage value (VgH), the high drain voltage value (VdH), and the low drain voltage value (VdL) are set so as to satisfy relational expressions of "VgH−VdH<Vth and VgH−VdL>Vth where Vth: a threshold voltage of the converting MOS transistor (Q1)".

The optical sensor circuit having the above configuration functions as follows. In an initial state where a subthreshold current flows through the converting MOS transistor (Q1) and the transistor has transient characteristics, when, on the basis of the high gate voltage value (VgH) and low gate voltage (VgL) which satisfy the relational expressions, the high gate voltage value (VgH) of the converting MOS transistor (Q1) is switchingly set to the low gate voltage value (VgL), in each of plural optical sensor circuits, the potential difference ΔW (where ΔW=W(Low)−W(High), W(Low) and W(High) are defined with reference to FIG. 4 on the basis of expression (2) relating W which will be described later, and the potential difference ΔW is similarly defined in association with this) is set by the difference between the high gate voltage value (VgH) of the converting MOS transistor (Q1) and the low gate voltage (VgL). Therefore, a potential difference which does not depend on dispersion of the threshold voltages of the converting MOS transistors (Q1) constituting optical sensor circuits of an image sensor can be set. Accordingly, the potential differences ΔW among different optical sensor circuits in an image sensor can be made equal to one another. As described above, the potential difference ΔW can be arbitrarily set, and hence a range showing a linear output characteristic region, and that showing a logarithmic output characteristic region can be arbitrarily controlled with respect to the terminal voltage (VC1) of the photoelectrical converting device which is a sensor detection potential of the dark state of each optical sensor circuit (pixel). According to the configuration, dispersion of outputs among optical sensor circuits (pixels) can be eliminated.

A second optical sensor circuit (corresponding to claim 2) is characterized in that, in the above configuration, the controlling means preferably has switching means (31) for switchingly setting the high gate voltage value (VgH) of the converting MOS transistor (Q1) to an arbitrary voltage value.

A third optical sensor circuit (corresponding to claim 3) is characterized in that, in the above configuration, the circuit preferably comprises an amplifying MOS transistor (Q2) for amplifying the voltage signal output from the converting MOS transistor (Q1).

A fourth optical sensor circuit (corresponding to claim 4) is characterized in that, in the above configuration, the circuit preferably comprises an output-selecting MOS transistor (Q3) for selectively outputting a voltage signal output from the amplifying MOS transistor (Q2).

A fifth optical sensor circuit (corresponding to claim 5) is characterized in that, in the above configuration, the circuit preferably comprises: another electrostatic capacitance element (capacitor C2) which accumulates charges on the basis of the terminal voltage of the photoelectrical converting device; and a charge-moving MOS transistor (Q4) for selectively moving charges between the electrostatic capacitance element and the other electrostatic capacitance element. The initial setting means (15) turns on the charge-moving MOS transistor (Q4), sets the gate voltage of the converting MOS transistor (Q1) to the high gate voltage value (VgH), only for the first predetermined time period, sets the drain voltage to the low drain voltage value (VdL), only for the second predetermined time period, charges/discharges the electrostatic capacitance element of the photoelectrical converting device and the other electrostatic capacitance element, thereafter sets the drain voltage to the high drain voltage value (VdH), and, after elapse of the third predetermined time period, sets the gate voltage to the low gate voltage value (VgL), and sets the high gate voltage value (VgH), the high drain voltage value (VdH), and the low drain voltage value (VdL) so as to satisfy the relational expressions. Thereafter, after elapse of a constant exposure time, the charge-moving MOS transistor (Q4) is turned off to set the other electrostatic capacitance element to an open state, and then the output-selecting MOS transistor (Q3) is turned on so that a sensor signal is output.

An image sensor (corresponding to claim 6) of the invention is characterized in that a one-dimensional or two-dimensional imaging region is formed by using the first to fifth optical sensor circuits as one pixel.

Effects of the Invention

According to the invention, in the initial state where a subthreshold current flows through the converting MOS transistor (Q1) and the transistor has transient characteristics, the high gate voltage value (VgH) of the converting MOS transistor (Q1) is switchingly set to the low gate voltage value (VgL), the potential difference $\Delta W$ (=W(Low)−W(High)) in each of plural optical sensor circuits is set by the difference between the high gate voltage value (VgH) of the converting MOS transistor (Q1) and the low gate voltage value (VgL). Therefore, a potential difference which does not depend on dispersion of the threshold voltages of the converting MOS transistors (Q1) constituting optical sensor circuits can be set. Accordingly, the potential differences $\Delta W$ among different optical sensor circuits in an image sensor can be made equal to one another. Since the potential difference $\Delta W$ can be arbitrarily set, a range showing a linear output region, and that showing a logarithmic output region can be arbitrarily controlled with respect to the terminal voltage (VC1) of the photoelectrical converting device which produces a sensor detection potential of the dark state of each optical sensor circuit (pixel). According to the configuration, dispersion of outputs among optical sensor circuits (pixels) can be eliminated.

From the above, according to the invention, in an optical sensor circuit which has linear and logarithmic output characteristics in accordance with the illuminance of incident light, a point of change between linear and logarithmic characteristic regions can be controlled, dispersion of potentials of the points of change among optical sensor circuits is stably eliminated, the S/N ratio at low illuminance or the like is high, the sensitivity is high, the dynamic range is wide, and the level of a residual image can be made low.

Figure 1:
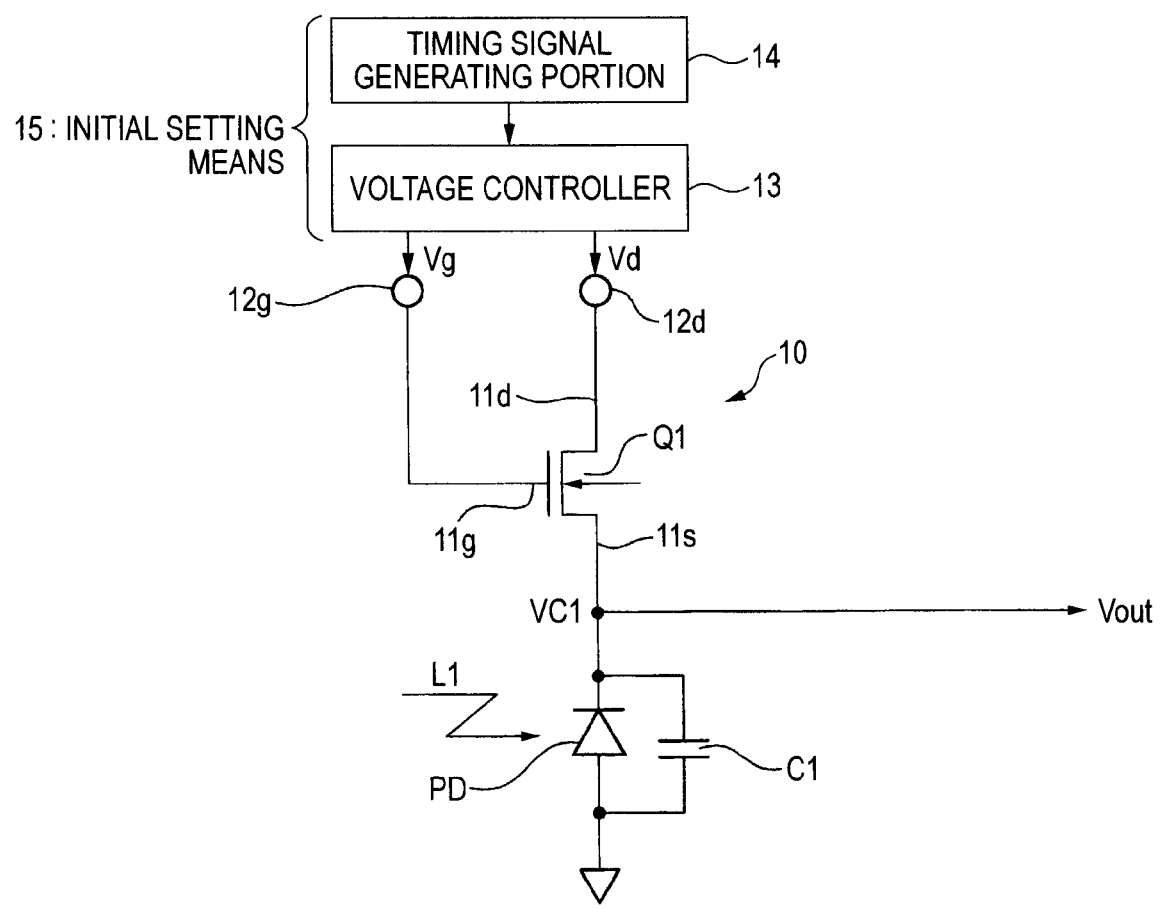
FIG. 1 is an electric circuit diagram of a first embodiment of the optical sensor circuit of the invention.

DESCRIPTION OF REFERENCE NUMERALS AND SIGNS 10 optical sensor circuit
13 voltage controller
14 timing signal generation
15 initial setting means
30 optical sensor circuit
31 switching means
40 optical sensor circuit
50 optical sensor circuit
60 optical sensor circuit PD photodiode
C1 capacity
C2 capacity
Q1 converting MOS transistor
Q2 amplifying MOS transistor
Q3 output-selecting MOS transistor
Q4 charge-moving MOS transistor

BEST MODE FOR CARRYING OUT THE INVENTION

Hereinafter, preferred embodiments (examples) of the invention will be described with reference to the accompanying drawings.

A first embodiment of the optical sensor circuit of the invention will be described with reference to FIGS. 1 to 9. FIG. 1 shows the circuit configuration of the optical sensor circuit of the first embodiment. In FIGS. 1 to 9, components which are substantially identical with those shown in FIGS. 21 to 26 used in the above description of the paragraph of "Background Art" are denoted by the same reference numerals.

The optical sensor circuit 10 comprises a photodiode PD serving as an optical sensor device which detects light L1 and converts it to an electric signal, and a capacitor C1 which is a parasitic capacity (including stray capacitance of wirings and the like) of the photodiode PD. The capacitor C1 is connected in parallel between the anode and cathode of the photodiode PD. The photodiode PD is an example of an optical sensor device, and the optical sensor device is not restricted to this.

For the photodiode PD, the converting MOS transistor Q1 which converts the sensor current of the photodiode to a sensor voltage having a logarithmic characteristic in a weak inversion state is disposed. The MOS transistor Q1 has a drain 11$d$, a source 11$s$, and a gate 11$g$. The cathode of the photodiode PD is connected to the source 11$s$ of the MOS transistor Q1. On the other hand, the anode of the photodiode PD is connected to the ground terminal.

Figure 2:
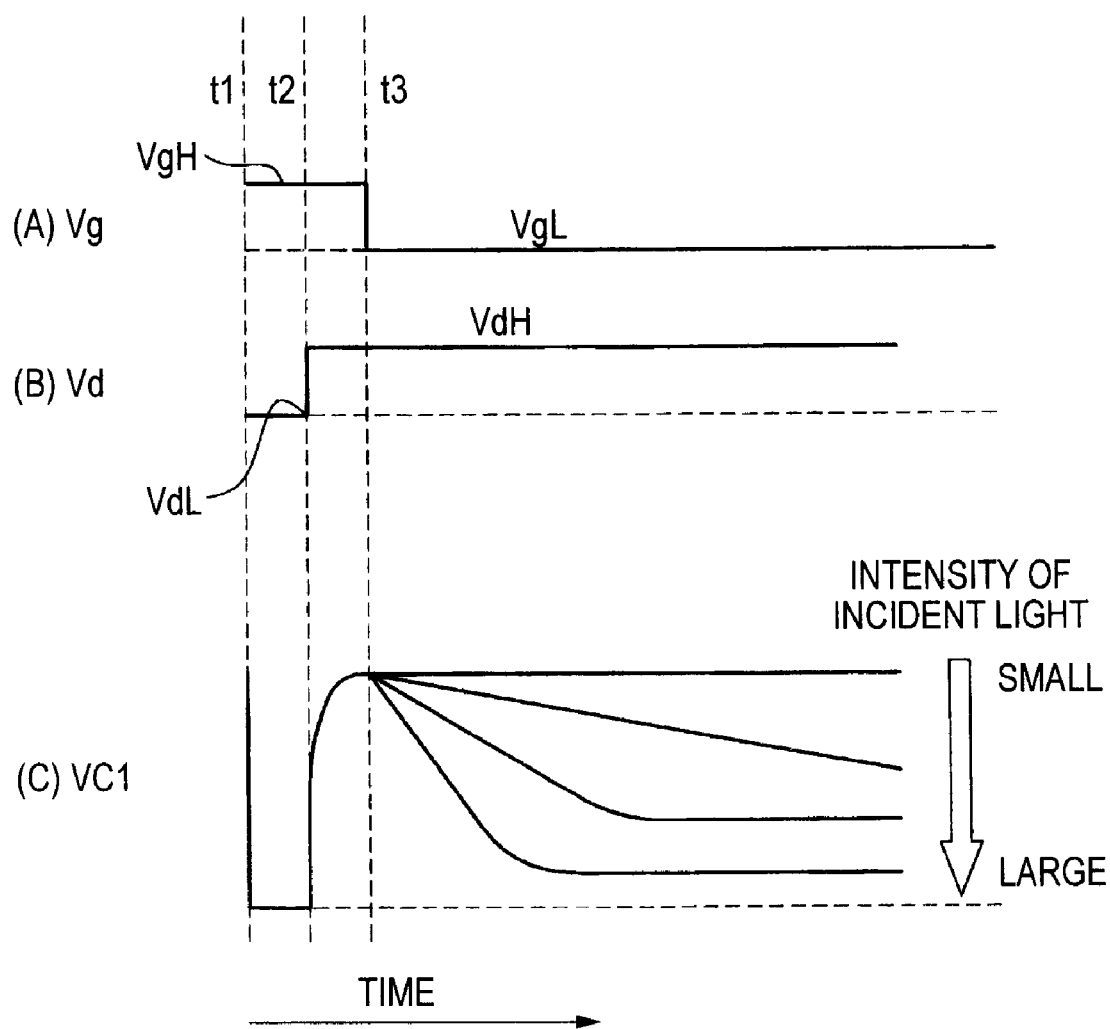
FIG. 2 is a timing waveform chart showing signal states of various portions of the optical sensor circuit of the first embodiment.

The drain voltage Vd is supplied from a voltage controller 13 to the drain terminal 12$d$ of the MOS transistor Q1, and the gate voltage Vg is supplied from the voltage controller 13 to the gate terminal 12$g$ of the transistor. The supply timings of the voltages Vd, Vg supplied by the voltage controller 13 are instructed by a timing signal generating portion 14. FIG. 2 shows a voltage waveform chart of the voltage Vd supplied by the voltage controller 13, and a voltage waveform chart of the voltage Vg supplied by the voltage controller 13.

An output voltage Vout from the optical sensor circuit 10 is taken out as the terminal voltage VC1 of the photodiode PD or the capacitor C1. In the photodiode PD, the sensor current which flows in accordance with the illuminance (or intensity) of the light L1 is converted to the sensor voltage to be detected as the output voltage Vout. The output voltage Vout coincides with the terminal voltage VC1 of the photodiode PD (or the capacitor C1).

In the optical sensor circuit 10, the drain voltage Vd and gate voltage Vg having a voltage waveform shown in FIG. 2 are supplied to obtain an electric signal corresponding to the light L1. Namely, in a time interval of timings t1 to t2, the gate voltage Vg of the MOS transistor Q1 is set to a high gate voltage value (VgH), and the drain voltage Vd is set to a low drain voltage value (VdL). Therefore, charging and discharging of the capacitor C1 of the photodiode PD are controlled, and charges accumulated in the capacitor C1 of the photodiode PD are discharged, whereby a residual image is suppressed. The operation of suppressing a residual image is referred to as "reset operation".

As shown in FIG. 2, at the timing of t2, the drain voltage Vd of the MOS transistor Q1 is set to a high drain voltage value VdH. At this time, the value of the gate voltage Vg remains at VgH or unchanged. After timing t3, the gate voltage Vg has a low gate voltage value (VgL).

The high gate voltage value VgH of the MOS transistor Q1 in a time interval of timings t1 to t3, the low drain voltage value VdL of the MOS transistor Q1 which is set during t1 and t2, and the high drain voltage value VdH of the MOS transistor Q1 which is set after timing t2 are set so that the potential differences among the values satisfy following relational expression (1).

$$VgH-VdH<Vth \text{ and } VgH-VdL>Vth \quad (1)$$

where Vth: the threshold voltage of the MOS transistor Q1.

Namely, the difference between the gate voltage value VgH and the drain voltage value VdH is set to be smaller than the threshold voltage Vth of the MOS transistor Q1, and that between the gate voltage value VgH and the drain voltage value VdL is set to be larger than the threshold voltage Vth of the MOS transistor Q1.

The operation in which the voltage values of the gate voltage Vg and drain voltage Vd of the MOS transistor Q1 are controlled and set on the basis of the voltage waveform pattern shown in FIG. 2 as described above with respect to the initial state is executed based on the operations of the voltage controller 13 and the timing signal generating portion 14. The voltage controller 13 and the timing signal generating portion 14 form controlling means of the optical sensor circuit 10. A portion of the control function which is realized by the voltage controller 13 and the timing signal generating portion 14 is referred to as "initial setting means 15".

Next, with reference to FIGS. 3 to 5, the sensor output of the optical sensor circuit 10 after timing t2, i.e., after the reset operation will be described.

Figure 3:
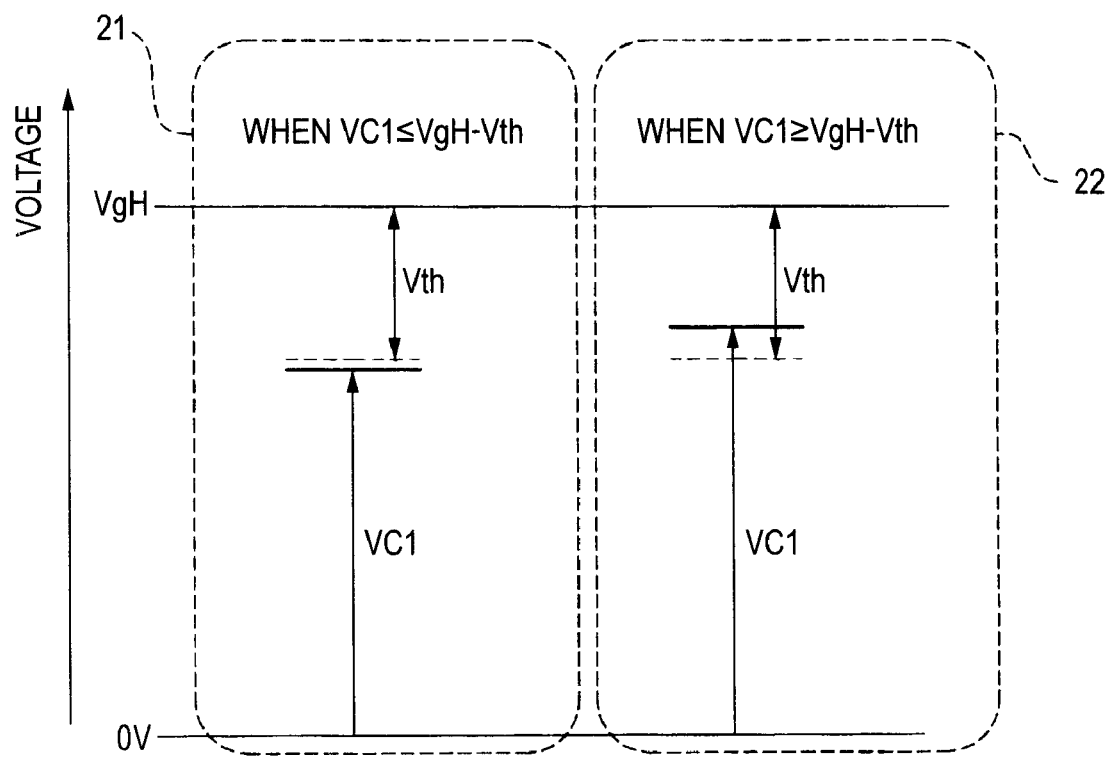
FIG. 3 is a diagram illustrating relationships among VgH, Vth, and VC1 of a MOS transistor Q1 of the optical sensor circuit of the first embodiment.

FIG. 3 shows relationships among the gate voltage value VgH and threshold voltage value Vth of the MOS transistor Q1, and the terminal voltage VC1 of the photodiode PD.

As shown in the portion of the left block 21 of FIG. 3, immediately after timing t2, the terminal voltage VC1 of the photodiode PD rapidly rises at a rate of the order of nano seconds or smaller to a voltage which is lower than the high gate voltage value VgH of the MOS transistor Q1 by a potential difference corresponding to the threshold voltage Vth of the MOS transistor Q1.

Thereafter, when the time further elapses, as shown in the portion of the right block 22 of FIG. 3, the terminal voltage VC1 of the photodiode PD rises, and the voltage difference between the high gate voltage value VgH of the MOS transistor Q1 and the terminal voltage VC1 of the photodiode PD is smaller than the threshold voltage Vth of the MOS transistor Q1. The reason why the terminal voltage VC1 of the photodiode PD rises is that the channel impedance of the MOS transistor Q1 is increased and a subthreshold current flows.

At the timing of t3 when the state where the subthreshold current flows and the transistor has transient characteristics is obtained as described above, the high gate voltage value VgH of the MOS transistor Q1 is switched to a low gate voltage value VgL.

The interval between timings t2 and t3 is preferably set to the order of about micro seconds. When the time interval is set in this way, the terminal voltage VC1 of the photodiode PD reaches the state where the subthreshold current flows. The object of the setting in which the difference between the high gate voltage value VgH and the high drain voltage VdH is set to be smaller than the threshold voltage Vth of the MOS transistor Q1 is to set the terminal voltage VC1 of the photodiode PD to the state where the subthreshold current flows.

After timing t3, the terminal voltage VC1 of the photodiode PD is detected, so that an electric signal corresponding to the incident light intensity of the light L1 can be obtained as shown in (C) of FIG. 2. The object of the operation of changing the gate voltage Vg of the MOS transistor Q1 from the high gate voltage value VgH to the low gate voltage value VgL is to set a voltage (potential difference) W indicated by following expression (2) high. The voltage (potential difference) W is obtained as the difference between the voltage VC1 and a voltage (Vg−Vth).

$$W = VC1 - (Vg - Vth)$$

where
VC1: the terminal voltage of the photodiode PD
Vg: the gate voltage of the MOS transistor Q1
Vth: the threshold voltage of the MOS transistor Q1

The expression (2) is an expression which is obtained in order to set the terminal voltage VC1 of the photodiode PD to the potential (Vg−Vth) which is lower than the gate voltage Vg by the threshold voltage Vth. When the terminal voltage VC1 is set high in this way, the region of a linear output characteristic can be increased. The reason of this will be described in detail with reference to FIG. 4.

Figure 4:
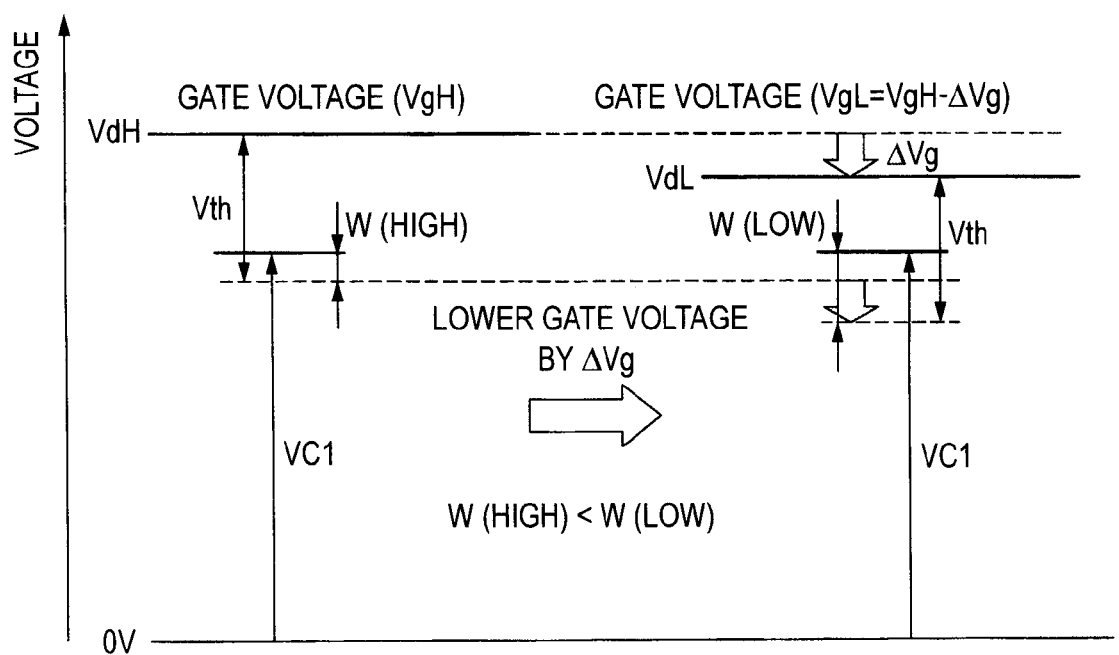
FIG. 4 is a diagram illustrating relationships among Vg, Vth, and VC1 of the MOS transistor Q1 of the optical sensor circuit of the first embodiment.

FIG. 4 shows relationships between the gate voltage Vg and threshold voltage Vth of the MOS transistor Q1, and the terminal voltage VC1 of the photodiode PD. When the gate voltage Vg is lowered, the relationships of the gate voltage Vg and the threshold voltage Vth can be changed while holding the terminal voltage VC1 of the photodiode PD. Namely, the above W which is indicated as a specific range in FIG. 4, i.e., the potential difference W can be changed.

FIG. 4 shows a change of the potential relationships shown in the left side of the figure to those shown in the right side of the figure in which the gate voltage Vg is lowered by ΔVg from the high gate voltage value VgH to the low gate voltage value VgL. Therefore, the range of W(High) (=VC1−(VgH−Vth)) based on the left potential relationships is changed to the range of W(Low) (=VC1−(VgL−Vth)) based on the left potential relationships. Here, with respect to the gate voltage Vg, there is a relationship of VgL=VgH−ΔVg. Therefore, a relationship of W(Low)>W(High) is obtained. In this way, the gate voltage Vg is changed only by ΔVg from the high gate voltage value VgH to the low gate voltage value VgL, whereby the range (potential difference) W can be increased.

Here, the potential difference ΔW is defined as ΔW=W(Low)−W(High). When the potential difference ΔW is defined in this way, the potential difference ΔW can be changed to an arbitrary value in a state of ΔW>0 by adequately changing the gate voltage Vg of the MOS transistor Q1 of the optical sensor circuit 10.

Figure 5:
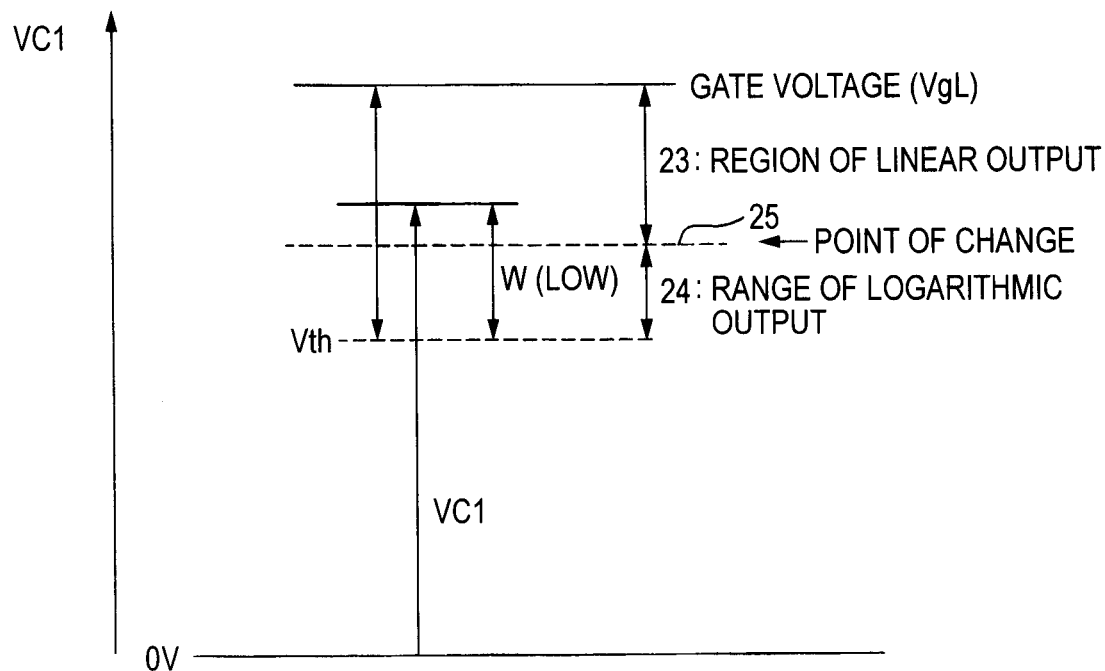
FIG. 5 is a diagram illustrating relationships among VgL, Vth, VC1, and a linear output range of the MOS transistor Q1 of the optical sensor circuit of the first embodiment.

FIG. 5 shows relationships among the low gate voltage value VgL and the threshold voltage Vth of the MOS transistor Q1, the terminal voltage VC1 of the photodiode PD, the range of the linear output characteristic, and the like. In FIG. 5, a range 23 shows a region of the linear output characteristic, and a range 24 shows a region of the logarithmic output characteristic. The boundary 25 between the linear output characteristic region 23 and the logarithmic output characteristic region 24 is a point of change.

As shown in FIG. 5, the terminal voltage VC1 of the photodiode PD can be set to an arbitrary potential in the linear output characteristic region 23. Therefore, the case where the embodiment is applied to an image sensor (imaging region) configured by plural pixels, such as a two-dimensional MOS image sensor is effective in the case where output dispersion of optical sensor circuits due to dispersion of threshold voltages of pixels of MOS transistors is to be suppressed.

Next, with reference to FIGS. 6 to 9, the manner of suppressing dispersion of, for example, outputs of two optical sensor circuits (pixels) A, B will be described.

Figure 6:
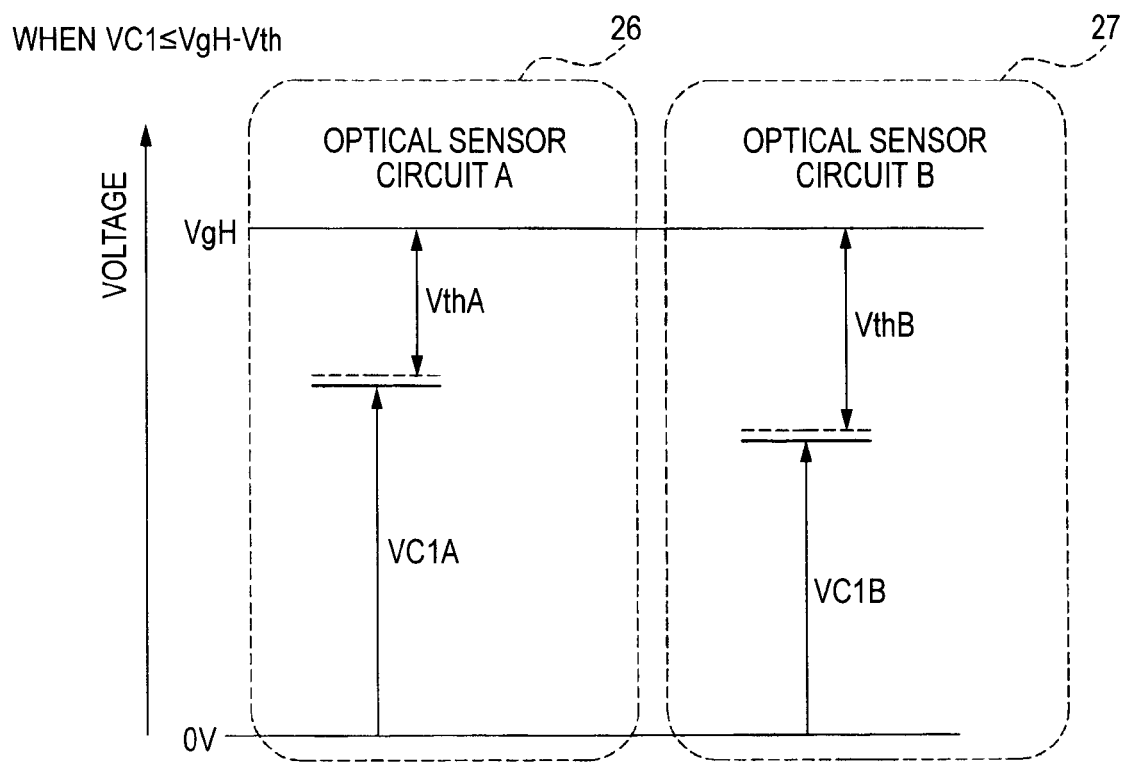
FIG. 6 is a diagram illustrating relationships among VgH, Vth, and VC1 of MOS transistors Q1 of optical sensor circuits A, B of the first embodiment.

As shown in FIG. 6, after the reset operation at timing t2, in each of the optical sensor circuits A, B, the above-mentioned terminal voltage VC1 of the photodiode PD rapidly rises at a rate of the order of nano seconds or smaller to a voltage which is lower than the set gate voltage of the MOS transistor Q1 by a potential difference corresponding to the threshold voltage Vth of the MOS transistor Q1. At this time, since the threshold voltage Vth of the MOS transistor Q1 is dispersed between the optical sensor circuits A, B, the terminal voltages VC1 of the optical sensor circuits A, B are different from each other. Namely, as shown by blocks 26, 27 of FIG. 6, the terminal voltage of the optical sensor circuit A is VC1A, and that of the optical sensor circuit B is VC1B.

Figure 7:
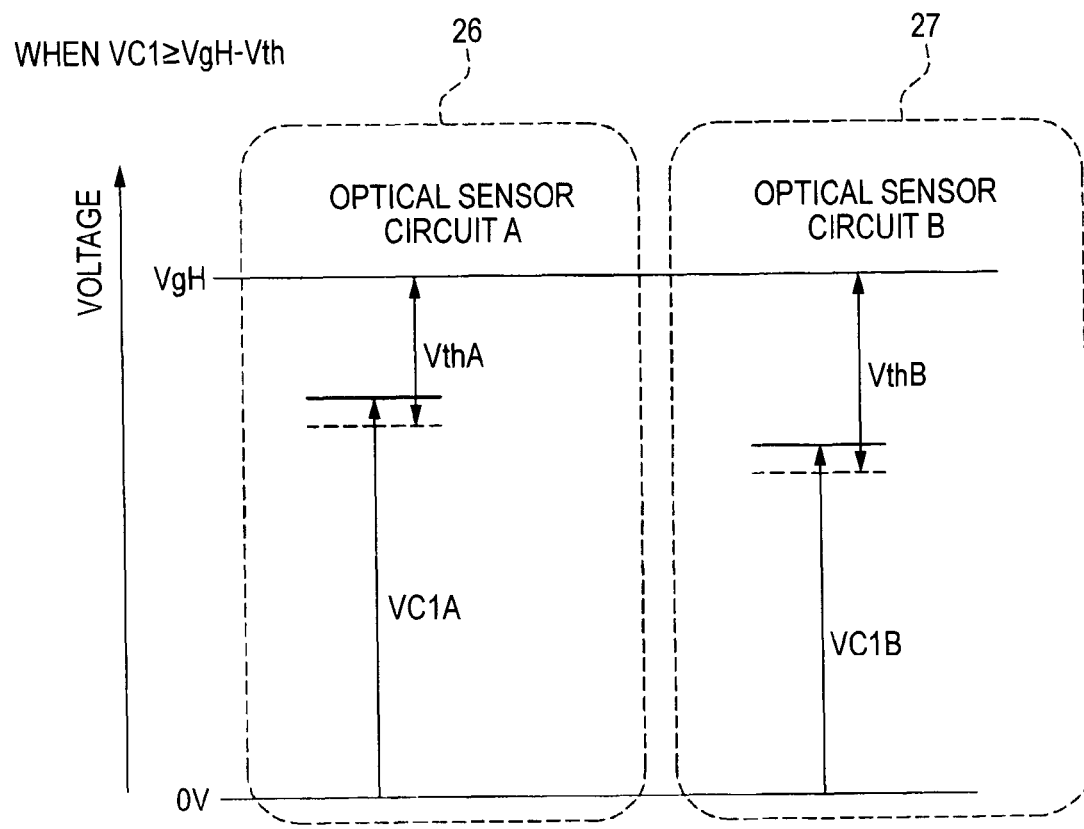
FIG. 7 is a diagram illustrating relationships among VgH, Vth, and VC1 of the MOS transistors Q1 of the optical sensor circuits A, B of the first embodiment.

When the time further elapses thereafter, a state shown in FIG. 7 is obtained. Namely, in each of the optical sensor circuits A, B of the same blocks 26, 27 of FIG. 7, in accordance with the rise of the potential (VC1A, VC1B) of the terminal voltage of the photodiode PD, the potential difference between the high gate voltage value VgH of the MOS transistor Q1 and the terminal voltage of the photodiode PD is equal to or lower than the threshold voltage (VthA, VthB) of the MOS transistor Q1. The channel impedance of the MOS transistor Q1 is increased, and hence the subthreshold current flows. This causes the potential (VC1A, VC1B) of the terminal voltage of the photodiode PD to rise.

Figure 8:
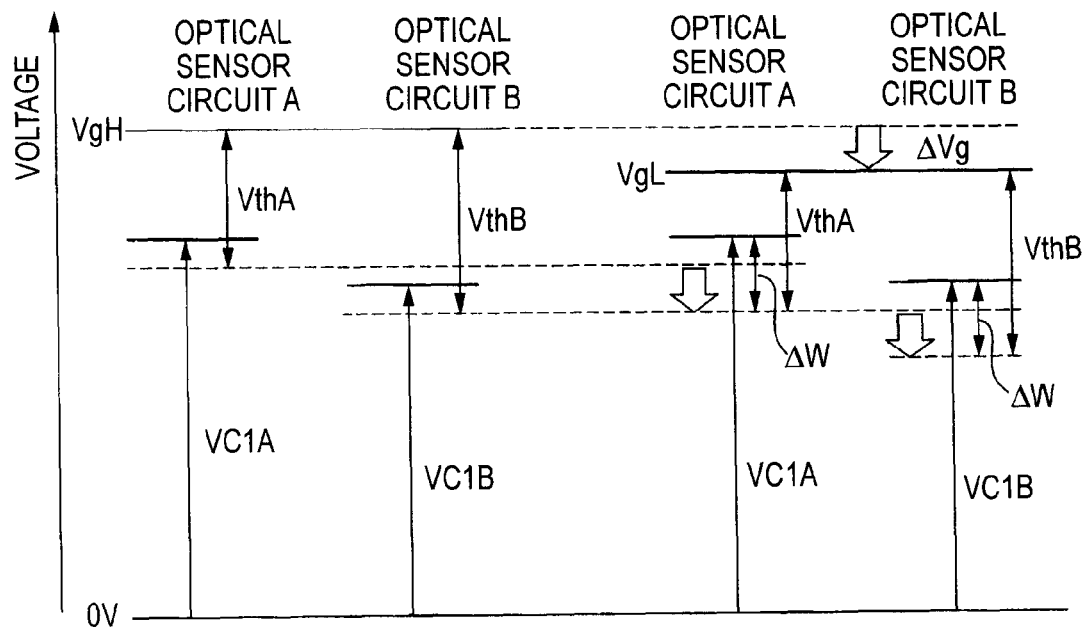
FIG. 8 is a diagram illustrating relationships (after the gate voltage is lowered by $\Delta Vg$) among VgH, Vth, and VC1 of the MOS transistors Q1 of the optical sensor circuits A, B of the first embodiment.

When, in the state where the subthreshold current flows and the transistor has transient characteristics, the high gate voltage value VgH of the MOS transistor Q1 is switchingly set to the low gate voltage value VgL, a state shown in FIG. 8 is obtained. In the two optical sensor circuits A, B, the potential difference ΔW (=W(Low)−W(High)) between above-described W(Low) and W(High) is set as the difference (ΔVg) of the high gate voltage value VgH of the MOS transistor Q1 and the low gate voltage value VgL. Therefore, the potential difference does not depend on dispersion of the threshold voltages of the MOS transistors Q1 constituting the optical sensor circuits A, B. Accordingly, the potential differences ΔW (=W(Low)−W(High)) in the different optical sensor circuits A, B can be made equal to each other.

As described above, the potential difference ΔW can be arbitrarily set. Therefore, the range showing the linear output region, and that showing the logarithmic output region can be arbitrarily controlled with respect to the terminal voltage VC1 of the photodiode PD which produces the sensor detection potential of the dark state of each optical sensor circuit (pixel). According to the configuration, dispersion of outputs among optical sensor circuits (pixels) can be eliminated.

Figure 9:
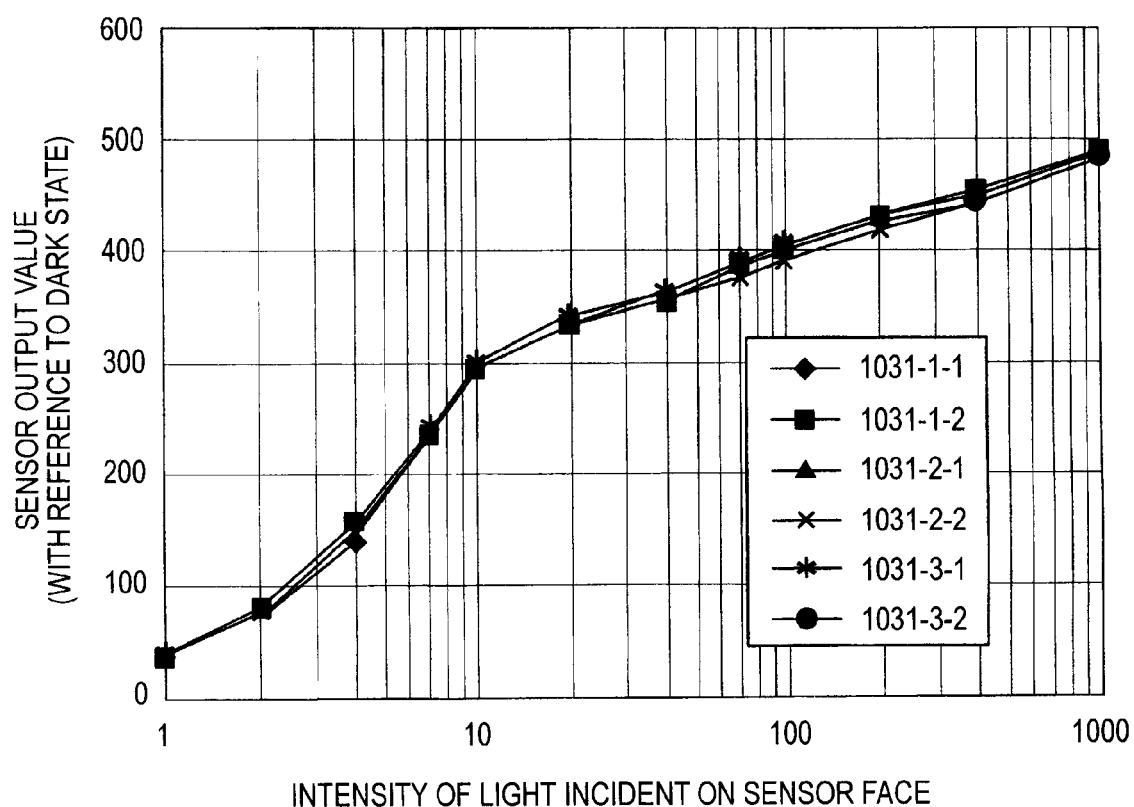
FIG. 9 is a graph showing sensor output characteristics of optical sensor circuits of an image sensor configured by optical sensor circuits of the first embodiment.

FIG. 9 shows sensor output characteristics in the case where the optical sensor circuit 10 of the embodiment and the driving method are applied to plural (for example, six) optical sensor circuits. As apparent from the sensor output characteristics of FIG. 9, dispersion of sensor output values among six pixels is not substantially produced. When the optical sensor circuit of the embodiment and the driving method are used, the problem of a prior art optical sensor circuit, i.e., the problem in that the potential difference between the terminal voltage immediately after the reset, and the point of change of the linear and logarithmic characteristic regions is different among pixels can be solved.

Figure 10:
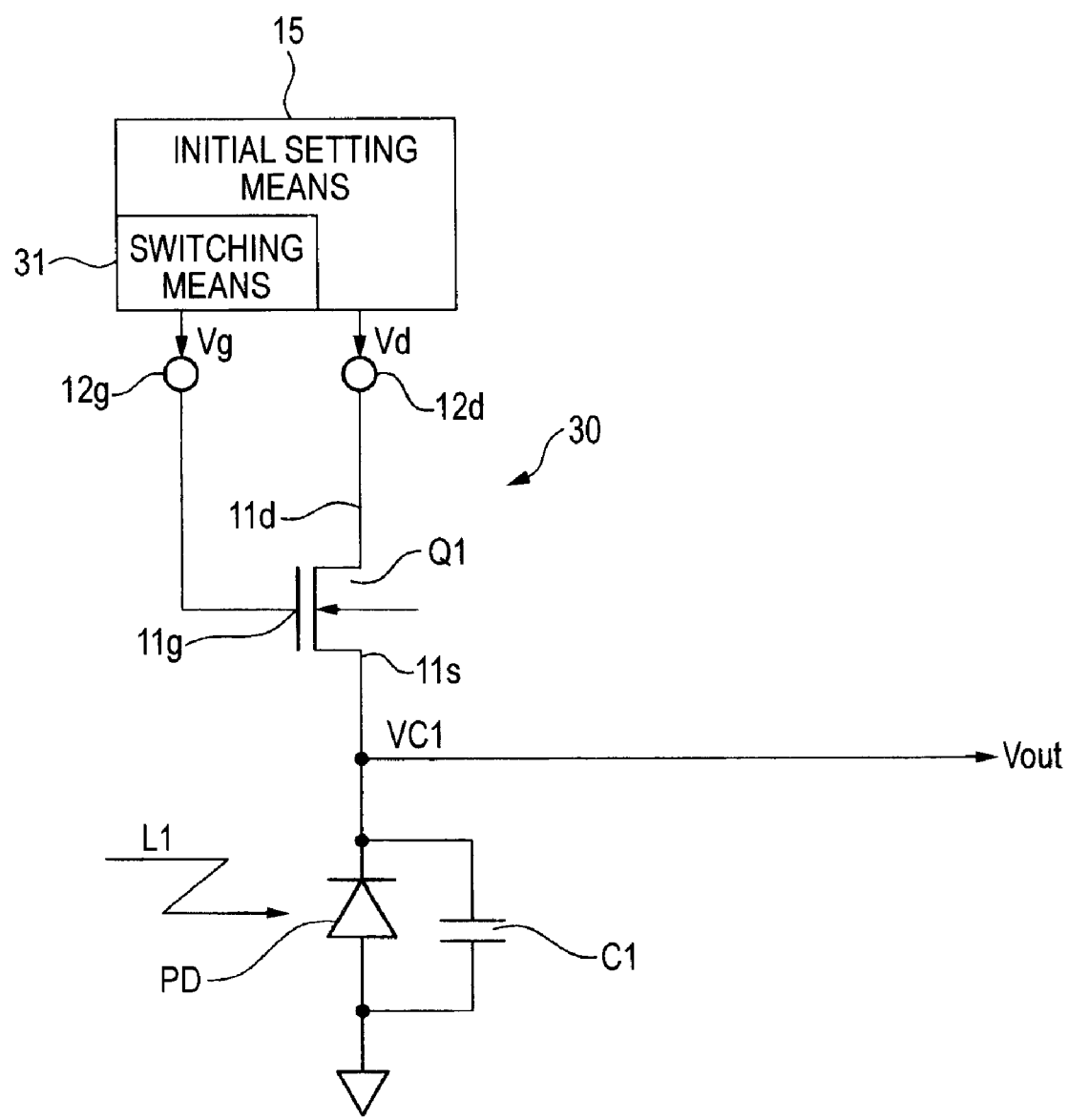
FIG. 10 is an electric circuit diagram of a second embodiment of the optical sensor circuit of the invention.

Next, a second embodiment of the optical sensor circuit of the invention will be described with reference to FIG. 10. In FIG. 10, components which are substantially identical with those described with reference to FIG. 1 are denoted by the same reference numerals.

An optical sensor circuit 30 shown in FIG. 10 is configured so that the initial setting means 15 comprises switching means 31 which, when the gate voltage Vg of the MOS transistor Q1 is to be set to the high gate voltage value VgH on the basis of the initial setting means 15 configured by the voltage controller 13 and the timing signal generating portion 14, allows a voltage value relating to the high gate voltage value VgH to be arbitrarily set. According to the optical sensor circuit 30, when driving control signals Vg, Vd for driving various portions of the optical sensor circuit 10 are given as shown in FIG. 2, an electric signal corresponding to the light L1 is obtained.

As described above, when the gate voltage Vg of the MOS transistor Q1 is to be set to the high gate voltage value VgH, the voltage value can be arbitrarily switchingly set by the switching means 31. Therefore, the potential difference ΔW which has been described in the first embodiment can be arbitrarily set. According to the optical sensor circuit 30 of the second embodiment, consequently, the high gate voltage value VgH of the gate voltage Vg of the MOS transistor Q1 can be set as described above. According to the configuration, the linear and logarithmic output characteristics can be arbitrarily set in the sensor output characteristic.

Figure 11:
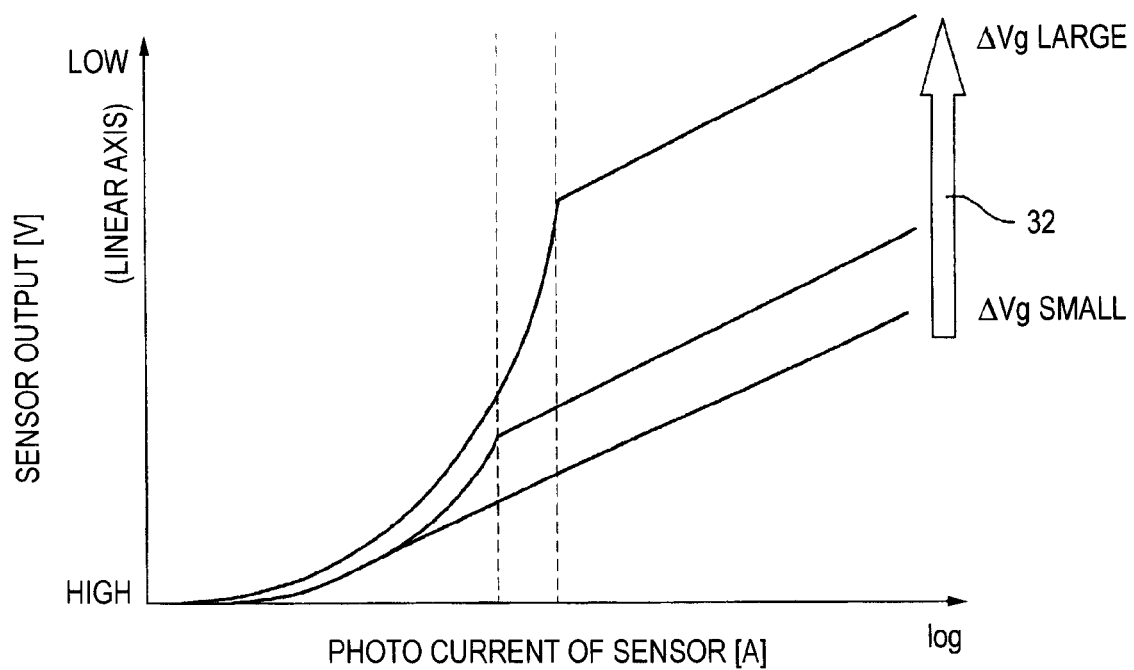
FIG. 11 is a graph showing change characteristics of the optical sensor circuit of the second embodiment.

FIG. 11 shows characteristic patterns of sensor output characteristics obtained by the optical sensor circuit 30 of the second embodiment. The abscissa of FIG. 11 is indicated on a logarithmic scale (log). The high gate voltage value VgH of the gate voltage Vg of the MOS transistor Q1 is arbitrarily switched, so that the sensor signal can be output in an optimum state corresponding to imaging conditions. When ΔVg is changed from "small" to "large" with respect to the high gate voltage value VgH of the gate voltage Vg, the sensor output characteristic is changed as indicated by the arrow 32.

Figure 12:
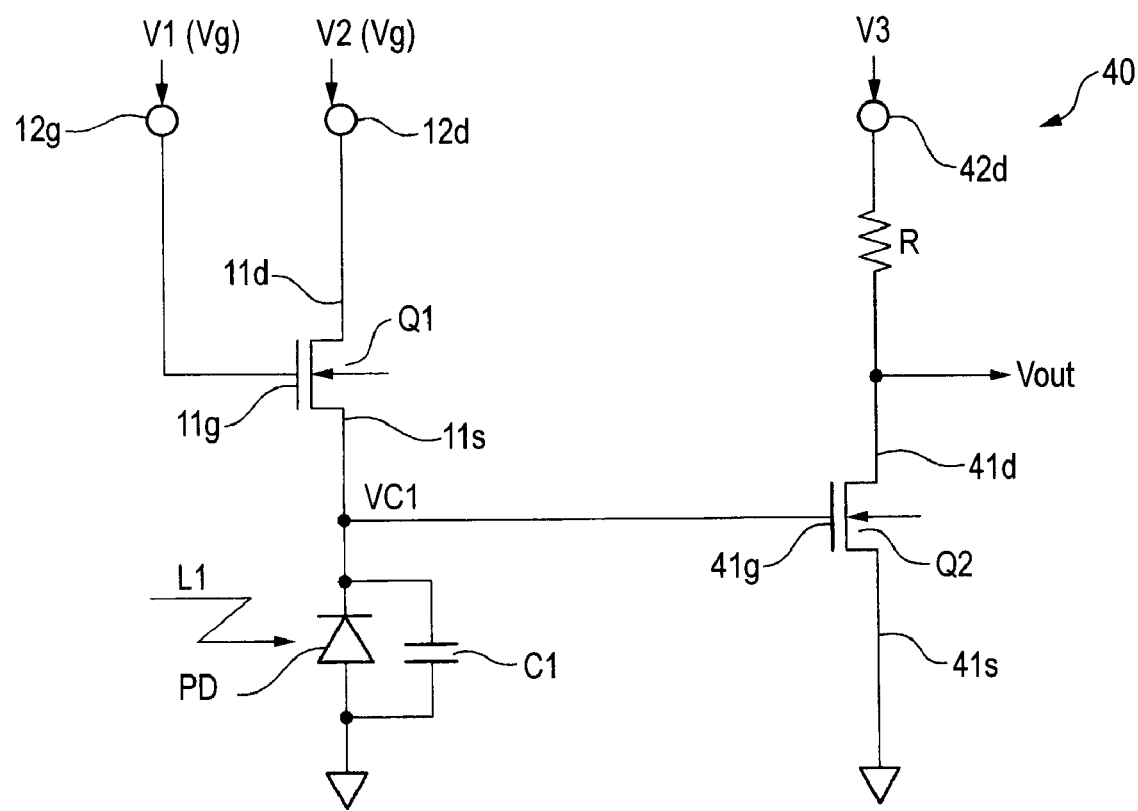
FIG. 12 is an electric circuit diagram of a third embodiment of the optical sensor circuit of the invention.
Figure 13:
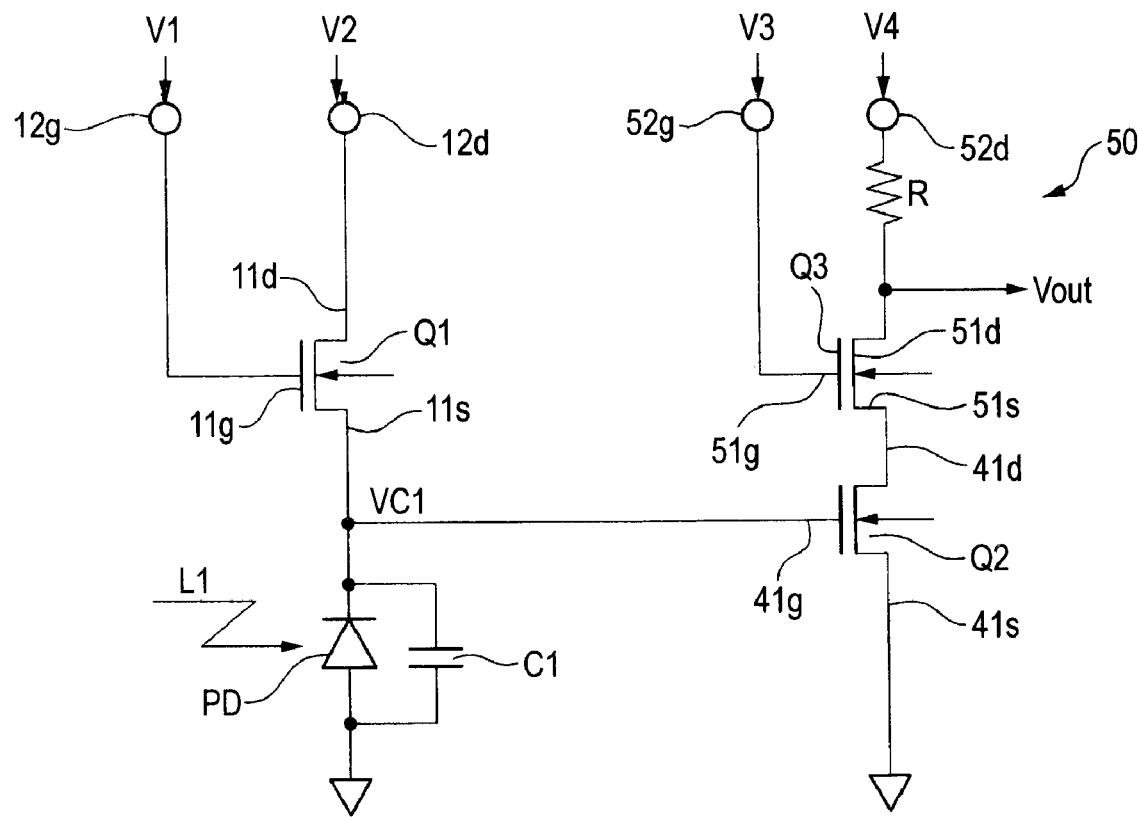
FIG. 13 is an electric circuit diagram of a fourth embodiment of the optical sensor circuit of the invention.

FIGS. 12 and 13 show modifications of the optical sensor circuit of the invention. FIG. 12 shows an optical sensor circuit of a third embodiment of the invention, and FIG. 13 shows an optical sensor circuit of a fourth embodiment of the invention.

In the optical sensor circuit 40 of the third embodiment shown in FIG. 12, a second MOS transistor Q2 for amplifying the sensor output voltage is added to the circuit elements of the optical sensor circuit of the first or second embodiment. Components which are substantially identical with those described in the above embodiments are denoted by the same reference numerals. However, a voltage V1 is supplied to the gate terminal 12g of the MOS transistor Q1, and a voltage V2 is supplied to the drain terminal 12d. For the sake of convenience, the voltages V1, V2 are shown. However, the voltage V1 is identical with the above-described gate voltage Vg, and the voltage V2 is identical with the above-described drain voltage Vd.

In contrast to the second MOS transistor Q2, the converting MOS transistor Q1 which converts the sensor current of the photodiode PD to the sensor voltage having a logarithmic characteristic in a weak inversion state is assumed to be a first MOS transistor. The second MOS transistor Q2 is an amplifying MOS transistor for amplifying the sensor voltage output from the first MOS transistor Q1.

In the optical sensor circuit 40, the terminal voltage VC1 of the photodiode PD which is the sensor output voltage is applied to the gate 41g of the MOS transistor Q2. A drain voltage V3 is supplied from the voltage controller or the like to the drain terminal 42d of the MOS transistor Q2, and the source 41s is connected to the ground terminal. The sensor output voltage Vout in an amplified state is taken out from the drain 41d of the second MOS transistor Q2.

In the optical sensor circuit 50 of the fourth embodiment shown in FIG. 13, a third MOS transistor Q3 is added to the circuit elements of the optical sensor circuit 40 of the third embodiment. In FIG. 13, components which are substantially identical with those described in the third embodiment are denoted by the same reference numerals.

The third MOS transistor Q3 is an output-selecting MOS transistor for selectively outputting a voltage signal output from the amplifying MOS transistor Q2.

In the optical sensor circuit 50, the drain 41d of the MOS transistor Q2 is connected to the source 51s of the MOS transistor Q3. A gate voltage V3 is supplied to the gate terminal 52g of the third MOS transistor Q3. A resistor R is connected to the drain 51d of the third MOS transistor Q3, and a drain voltage V4 is supplied to another terminal 52d of the resistor R. The sensor output voltage Vout is taken out from the drain 51d of the third MOS transistor Q3.

Figure 14:
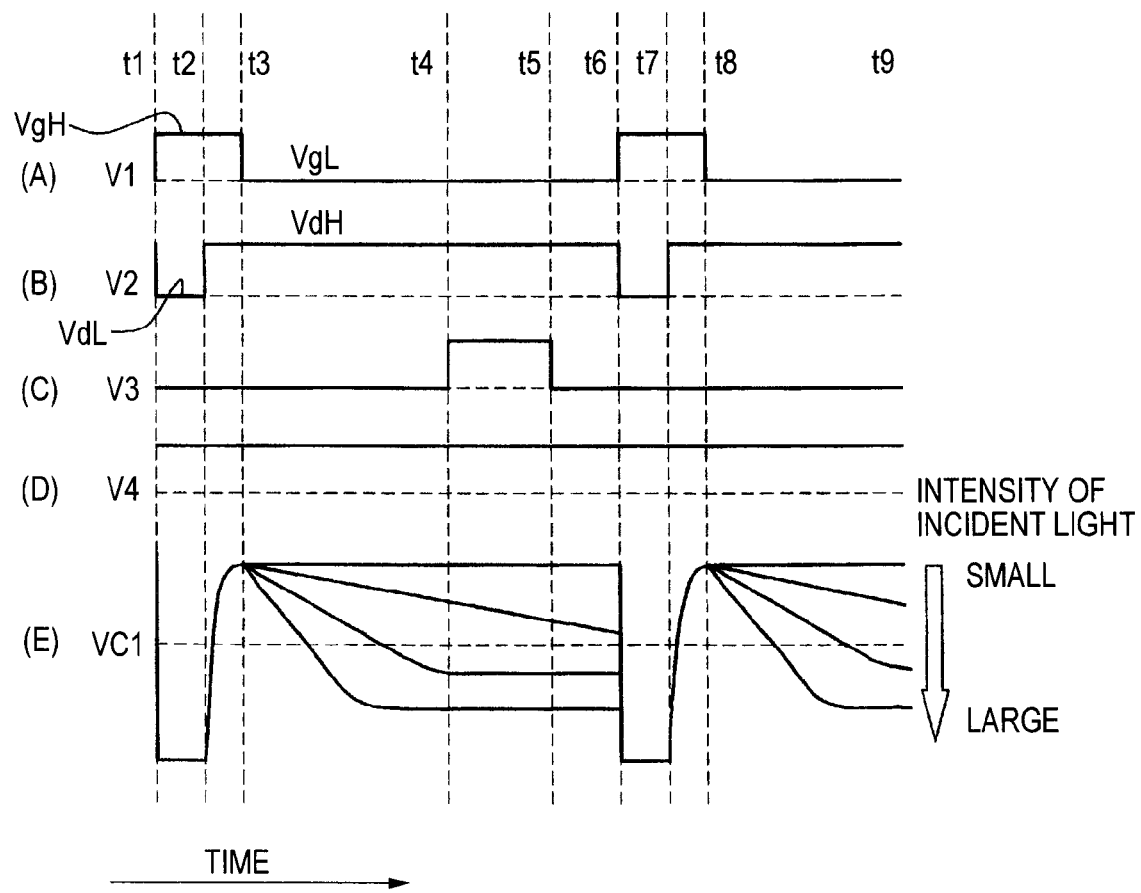
FIG. 14 is a timing waveform chart showing signal states of various portions of the optical sensor circuit of the third or fourth embodiment.

In the thus configured optical sensor circuits 40, 50, control signals (voltage signals V1, V2, V3, V4) for driving various portions are given as shown in FIG. 14, whereby an electric signal corresponding to the incident light L1 is obtained as indicated by VC1 in FIG. 14.

Figure 15:
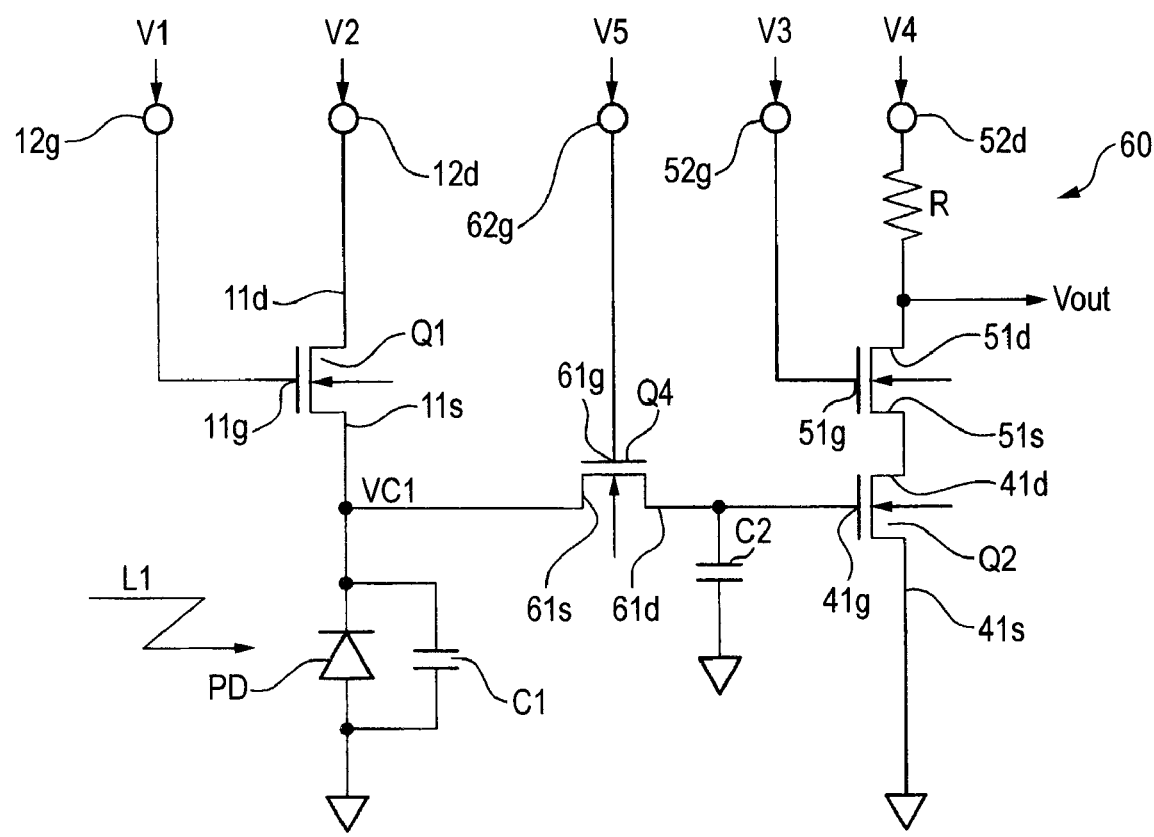
FIG. 15 is an electric circuit diagram of a fifth embodiment of the optical sensor circuit of the invention.

FIG. 15 shows an optical sensor circuit of a fifth element of the invention. In the optical sensor circuit 60, a fourth MOS transistor Q4 is added to the circuit elements of the optical sensor circuit 50 of the fourth embodiment. Components which are substantially identical with those described in the fourth embodiment are denoted by the same reference numerals. In the optical sensor circuit 60, the source 61s of the fourth MOS transistor Q4 is connected to the cathode of the photodiode PD, and the drain 61d is connected to the gate 41g of the MOS transistor Q2. A voltage V5 is supplied to the gate terminal 62g of the gate 61g of the MOS transistor Q4.

The optical sensor circuit 60 further comprises, in the configuration of the optical sensor circuit 50 of the fourth embodiment, a capacitor C2 for accumulating charges, and the charge-moving fourth MOS transistor Q4. The fourth MOS transistor Q4 is a charge-moving MOS transistor for selectively moving charges between the capacitors C1 and C2. Based on the timing signals shown in FIG. 16, the above-described initial setting means 15 controls and sets the MOS transistors Q1 to Q4 in the following manner.

In a state where the charge-moving fourth MOS transistor Q4 is turned on by the voltage V5, the MOS transistors Q1 to Q3 are controlled and set.

The gate voltage V1 of the first MOS transistor Q1 is set to the high gate voltage value VgH, only for the predetermined time period between t1 to t3, the drain voltage V2 is set to the low drain voltage value VdL, only for the predetermined time period between t1 to t2, and the capacitor C1 of the photodiode PD and the capacitor C2 are charged/discharged. Thereafter, the drain voltage V2 is set to the high drain voltage VdH. After elapse of the above-mentioned predetermined time period (timing t3), the gate voltage V1 is set to the low gate voltage value VgL, and the high gate voltage value VgH and the high drain voltage value VdH are set so as to satisfy the above-described relational expression (1).

Thereafter, after elapse of a constant exposure time (timing t4), the charge-moving fourth MOS transistor Q4 is turned off. This causes the capacity C2 to be in an open state, and then the output-selecting third MOS transistor Q3 is turned on so that the sensor signal is output.

Figure 16:
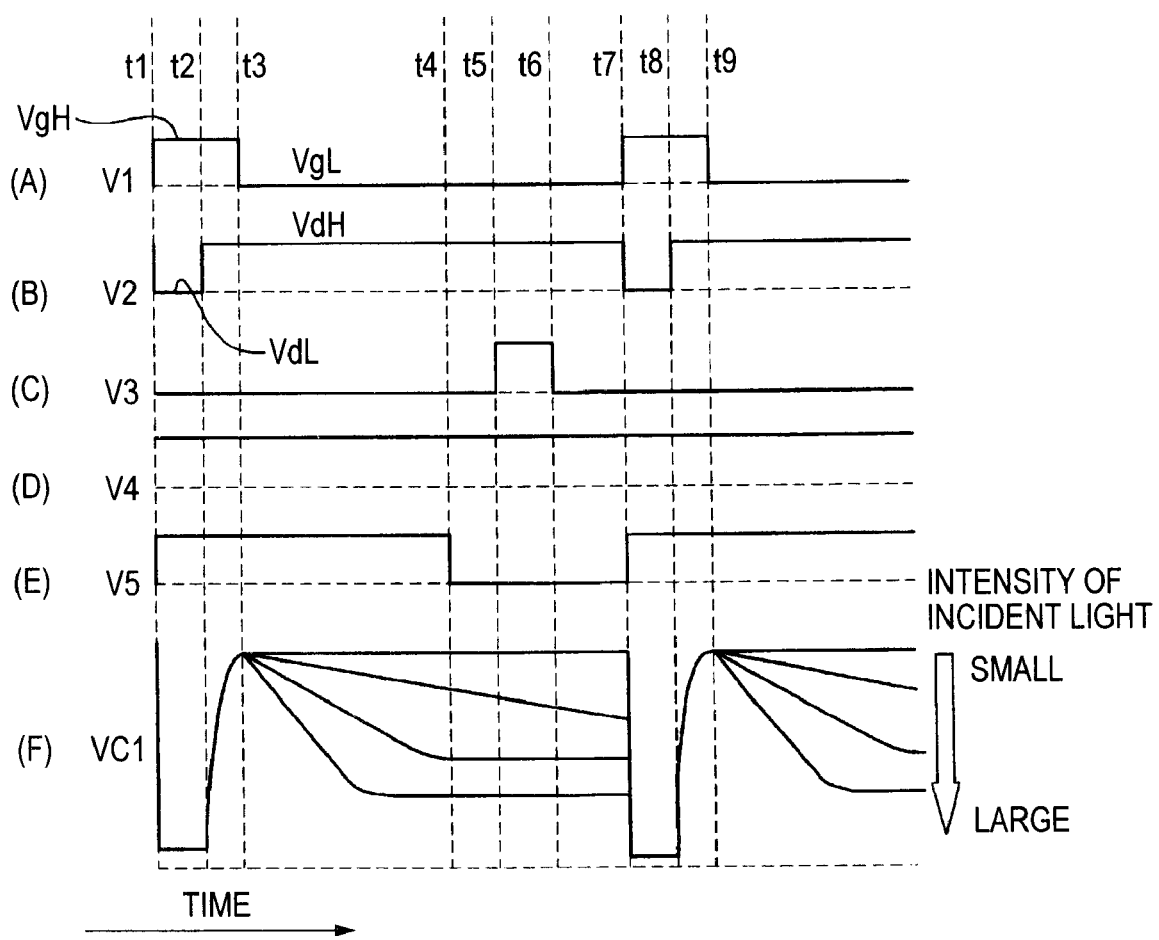
FIG. 16 is a timing waveform chart showing signal states of various portions of the optical sensor circuit of the fifth embodiment.

In the optical sensor circuit 60, as described above, the control signals (voltage signals V1, V2, V3, V4, V5) for driving various circuit portions are given as shown in FIG. 16, whereby an electric signal corresponding to the incident light intensity of the irradiating light L1 is obtained.

In the circuit configuration of the optical sensor circuit 60, when the MOS transistor Q4 is set to the off state after the timing of t4, charges of the capacitor C2 are held, and the charges of the capacitor C2 are held constant until the MOS transistor Q4 is then turned on. Namely, during the period when the MOS transistor Q4 is turned off, i.e., during the charge holding period of the capacitor C2, even when the terminal voltage of the capacitor C1 is changed, the same output signal is obtained from the pixel as the sensor output signal. When the optical sensor circuit 60 shown in FIG. 15 is operated on the basis of the timing signals shown in FIG. 16, therefore, it is possible to realize a pixel having a shutter function having a logarithmic output which is not affected by a residual image, and the dynamic range is wide.

An image sensor can be configured by using the above-described optical sensor circuit 10, 30, 40, 50, or 60 of the invention as a constituent element of one pixel, and arranging the circuits one-dimensionally or two-dimensionally.

Figure 17:
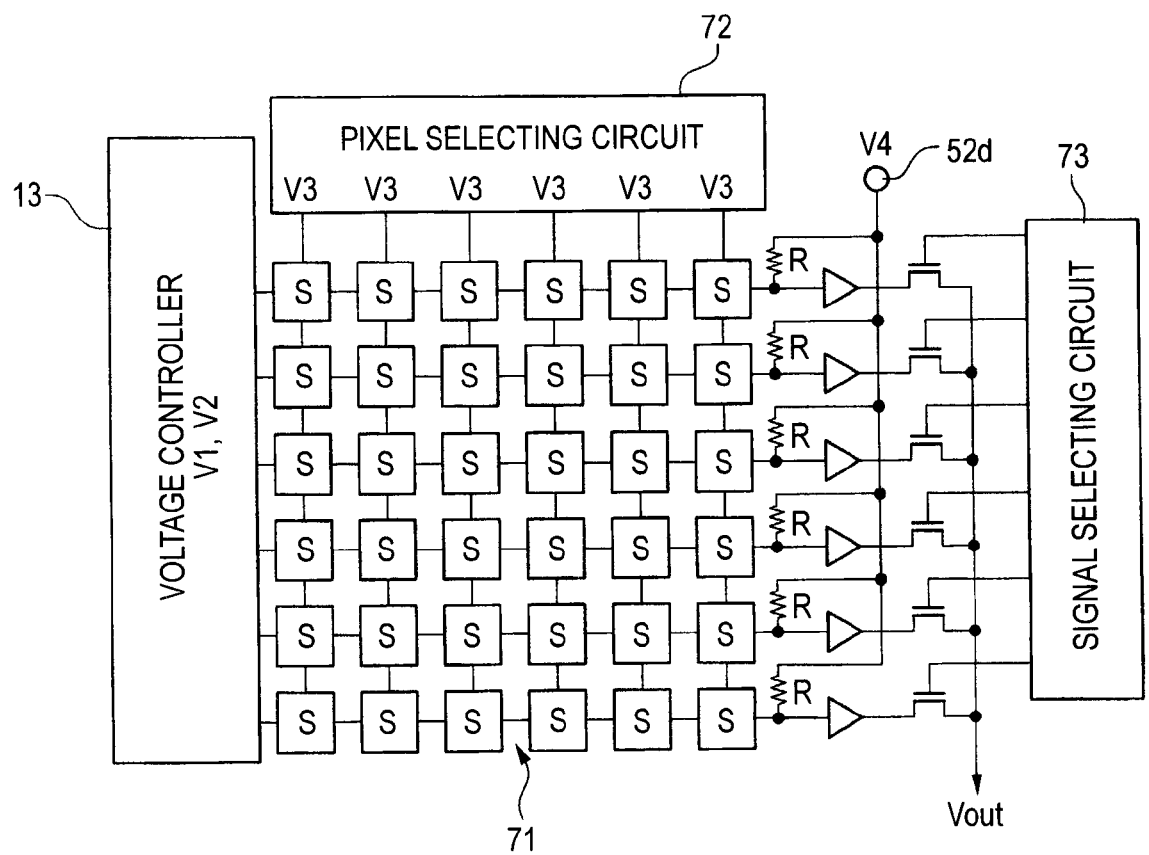
FIG. 17 is an electric circuit diagram showing an image sensor configured by using the optical sensor circuit of the fourth embodiment of the invention.

FIG. 17 shows a configuration example of an image sensor having a rectangular imaging region 71 which is formed by arranging the optical sensor circuit 50 shown in FIG. 13 as one pixel (S) in a two-dimensional matrix pattern. In FIG. 17, the block 13 is the above-described voltage controller, the block 72 is a pixel selecting circuit which is disposed in common to pixels S, and the block 73 is a signal selecting circuit for sequentially outputting pixel signals of the pixels S. The voltages V1, V2 are supplied from the voltage controller 13, the voltage V3 is supplied from the pixel selecting circuit 72, and the voltage V4 is supplied to the terminal 52d.

Figure 18:
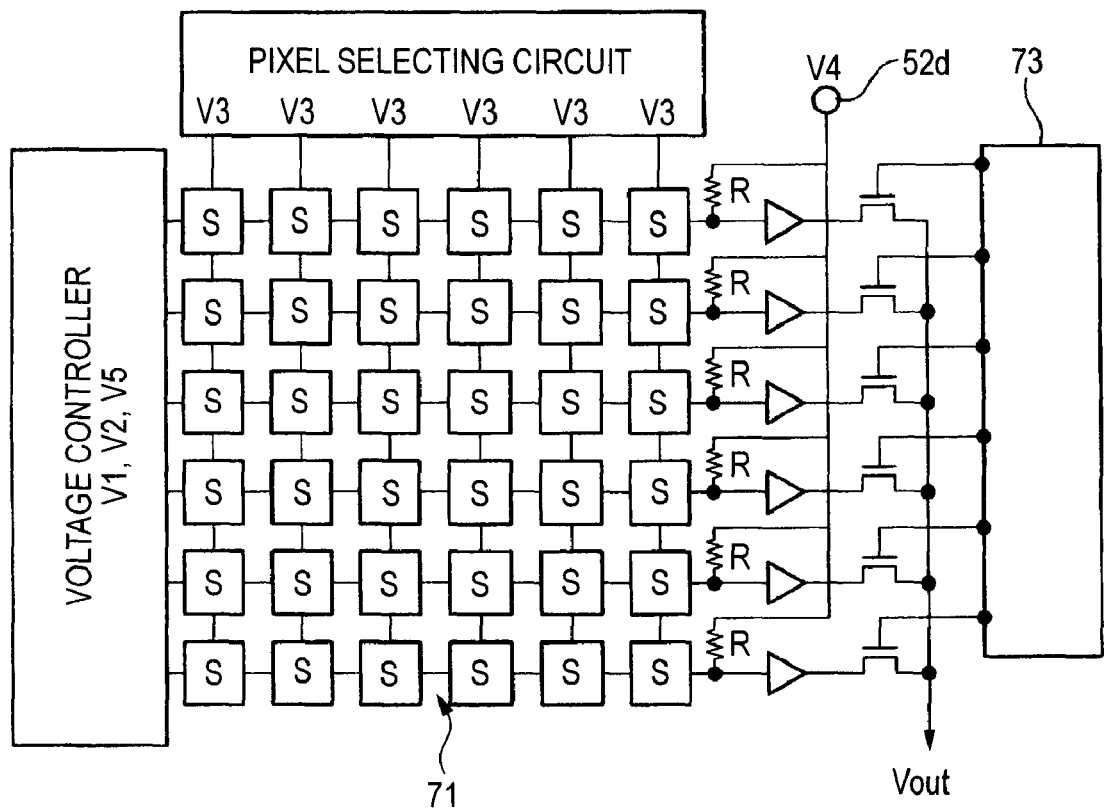
FIG. 18 is an electric circuit diagram showing an image sensor configured by using the optical sensor circuit of the fifth embodiment of the invention.

FIG. 18 shows a configuration example of an image sensor having the rectangular imaging region 71 which is formed by arranging the optical sensor circuit 60 shown in FIG. 15 as one pixel in a two-dimensional matrix pattern. In FIG. 18, the block 13 is the above-described voltage controller, the block 72 is a pixel selecting circuit which is disposed in common to pixels S, and the block 73 is a signal selecting circuit for sequentially outputting pixel signals of the pixels S. The voltages V1, V2, V5 are supplied from the voltage controller 13, the voltage V3 is supplied from the pixel selecting circuit 72, and the voltage V4 is supplied to the terminal 52d.

Figure 19:
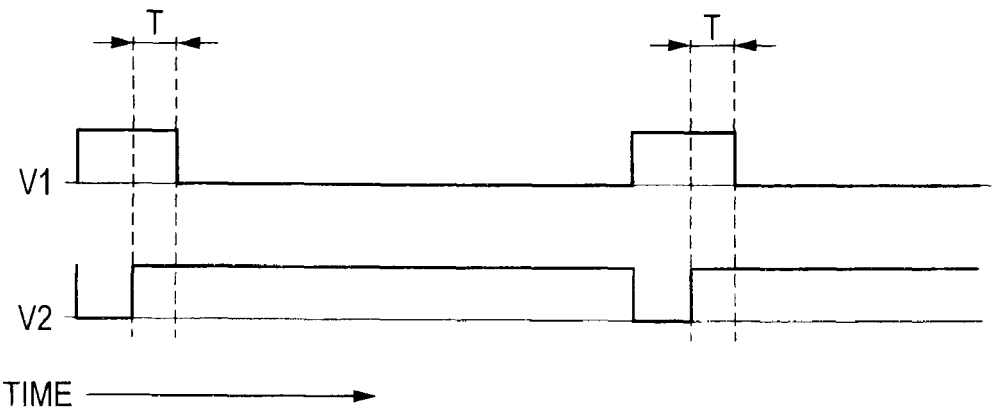
FIG. 19 is a timing waveform chart showing only voltages V1, V2.
Figure 20:
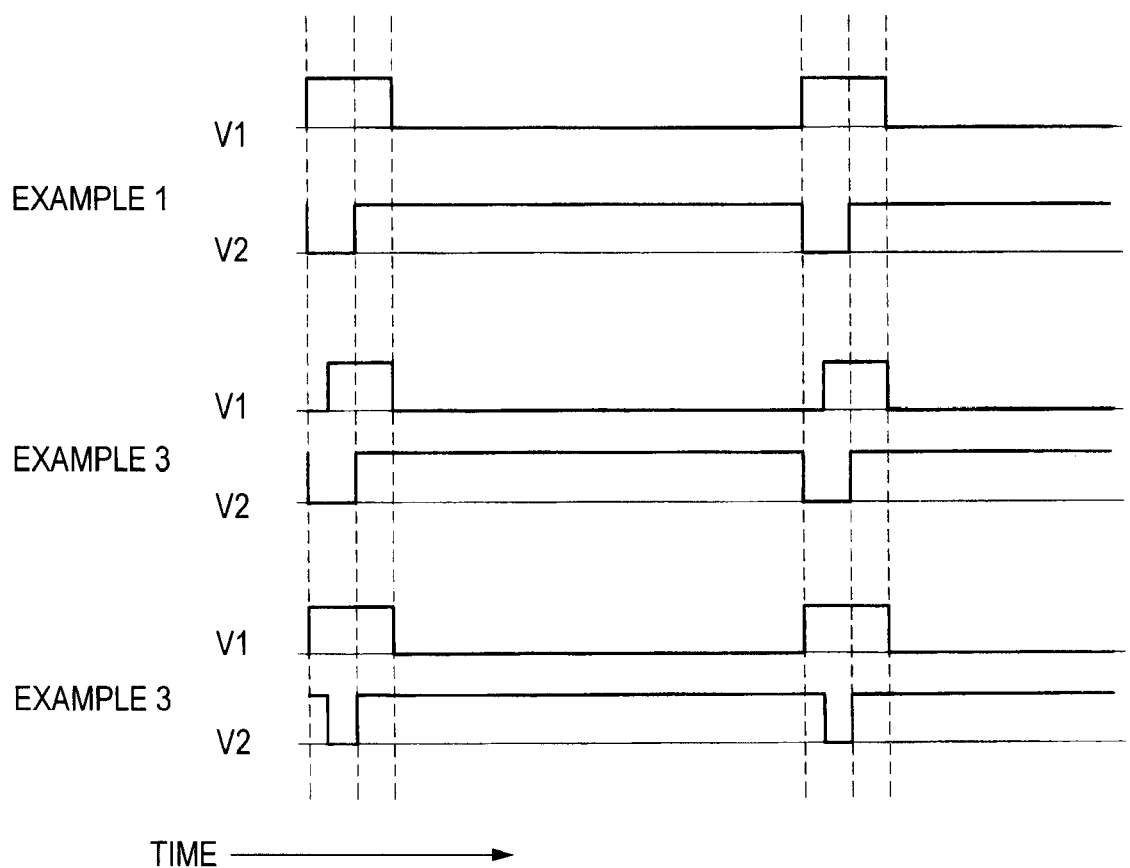
FIG. 20 is a timing waveform chart showing three Embodiments 1 to 3 with respect to examples of timings of rising of the voltage V1 and falling of the voltage V2.
Figure 21:
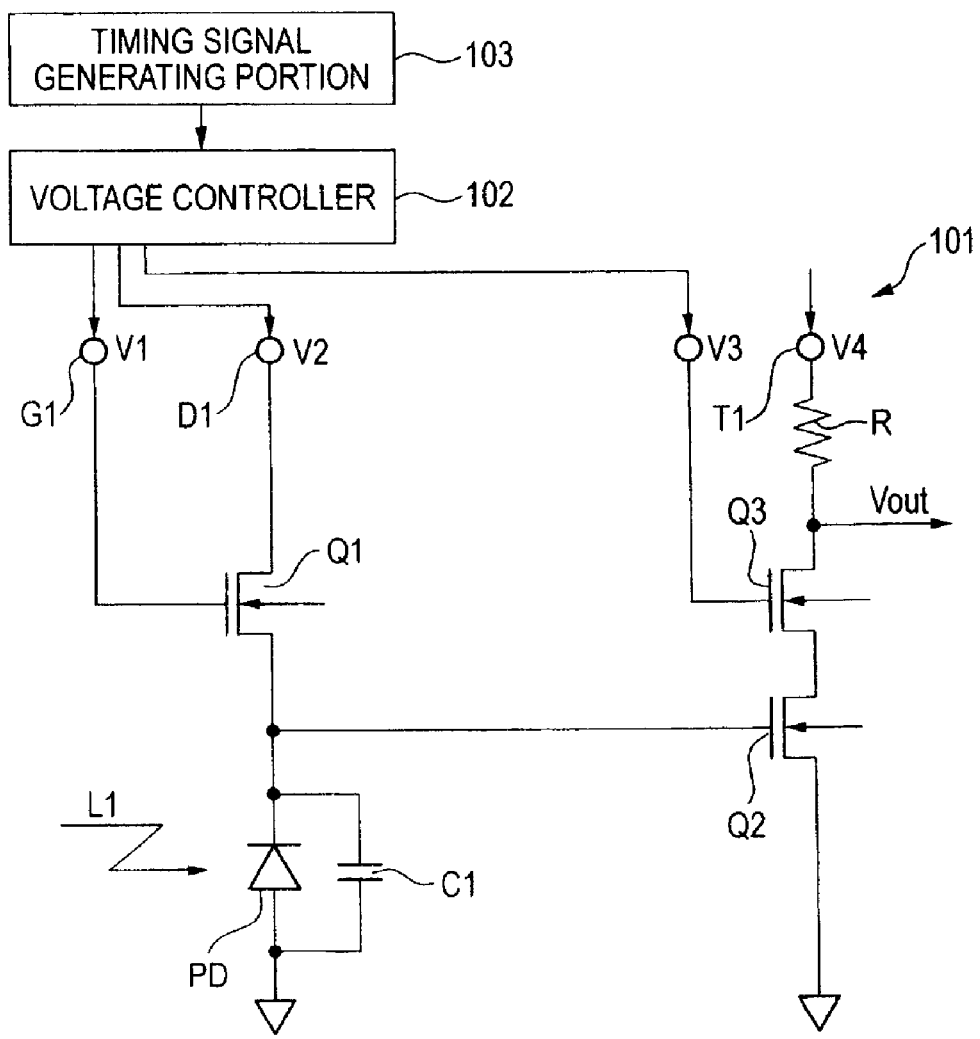
FIG. 21 is an electric circuit diagram of a prior art optical sensor circuit having a linear output characteristic.
Figure 22:
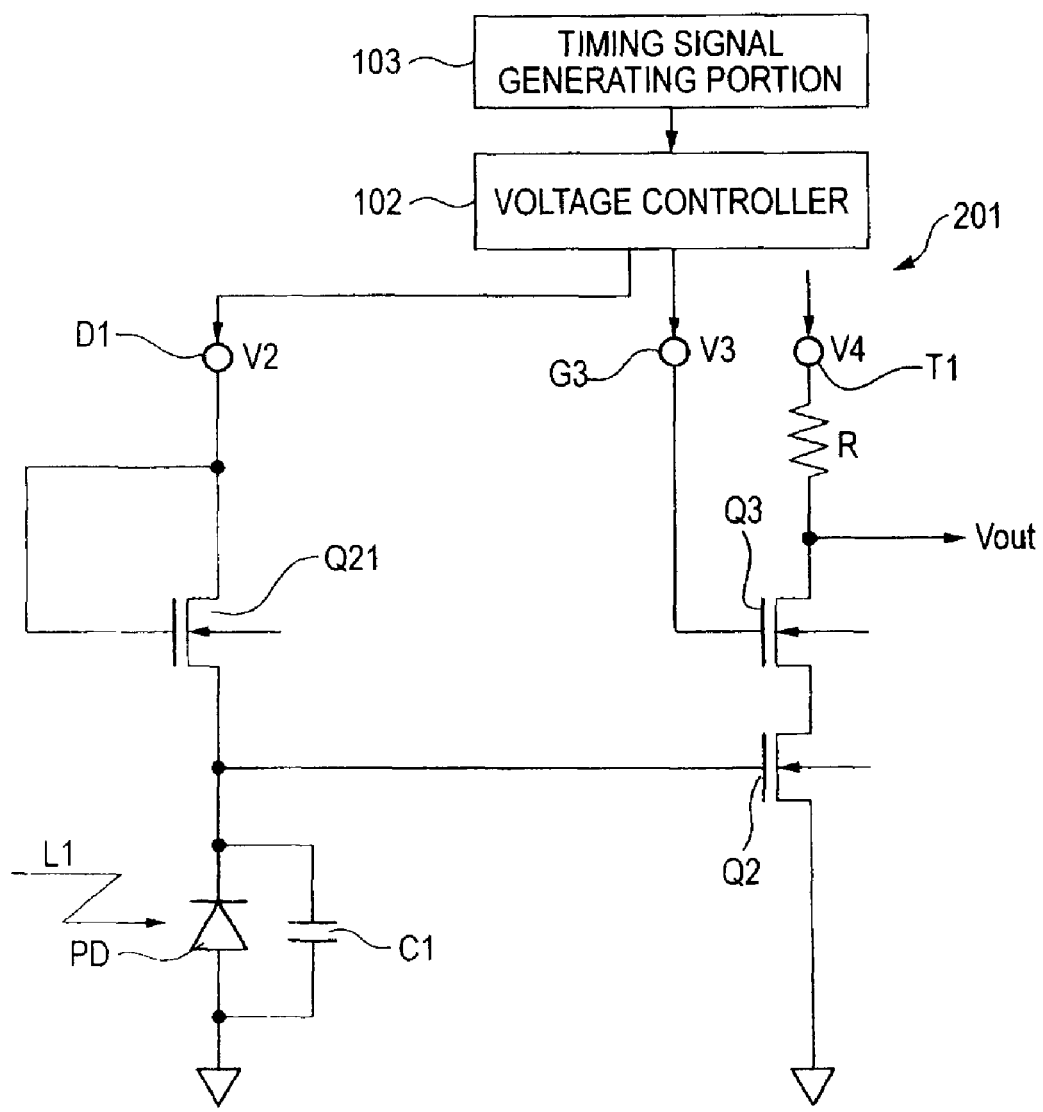
FIG. 22 is an electric circuit diagram of a prior art optical sensor circuit having a logarithmic output characteristic.
Figure 23:
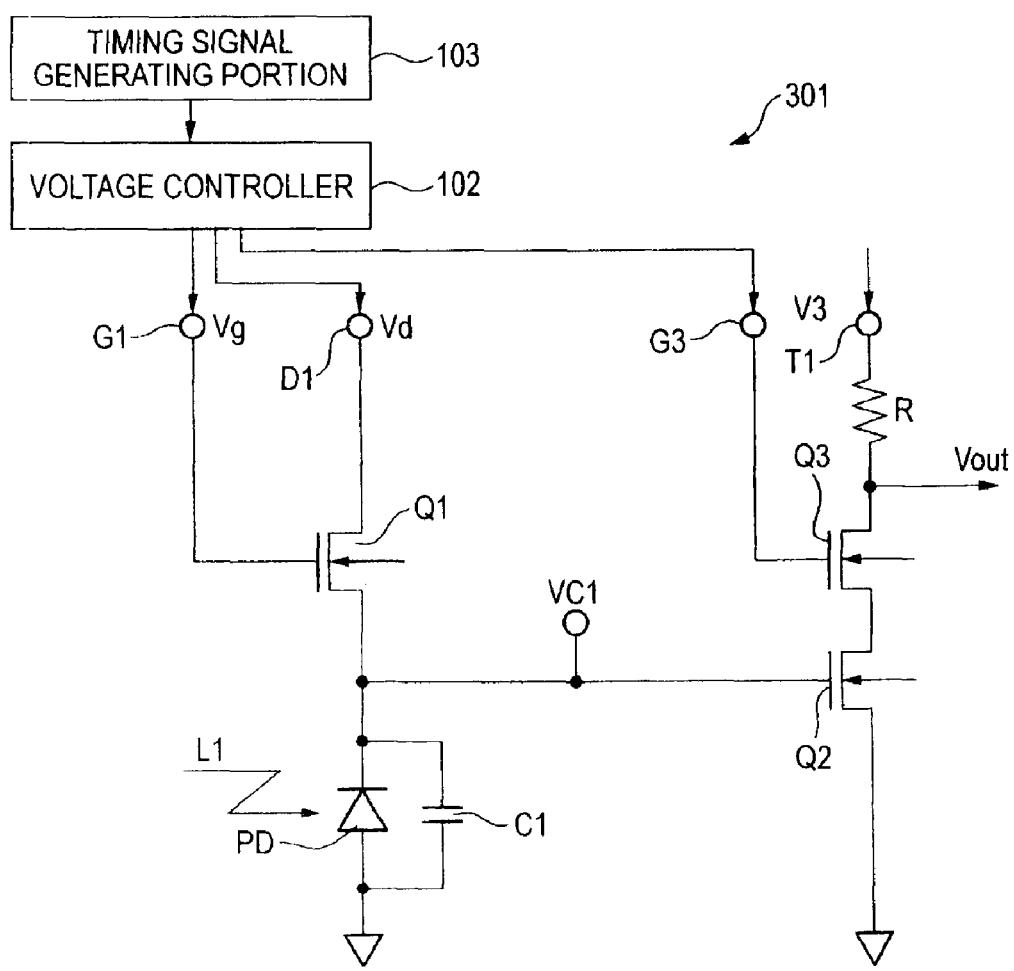
FIG. 23 is an electric circuit diagram of a prior art optical sensor circuit having linear and logarithmic output characteristics.
Figure 24:
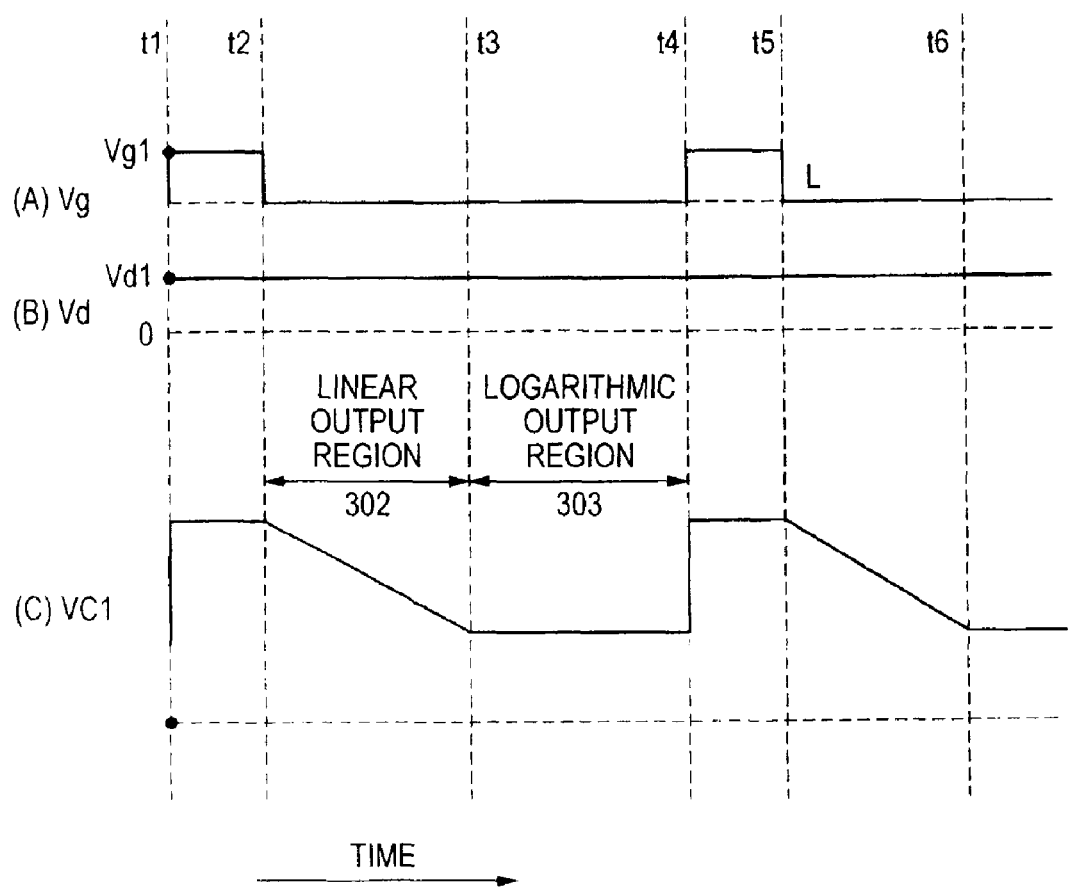
FIG. 24 is a timing waveform chart showing signal states of various portions of the prior art optical sensor circuit having linear and logarithmic output characteristics.
Figure 25:
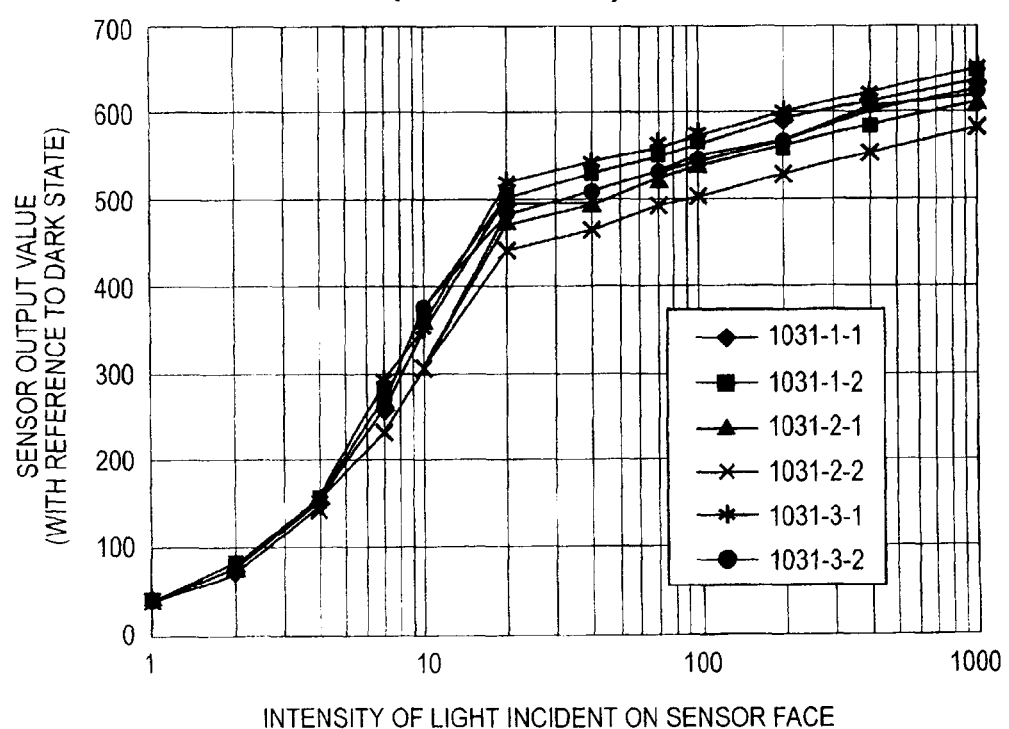
FIG. 25 is a graph showing sensor output characteristics of optical sensor circuits of an image sensor formed by prior art optical sensor circuits having linear and logarithmic output characteristics.
Figure 26:
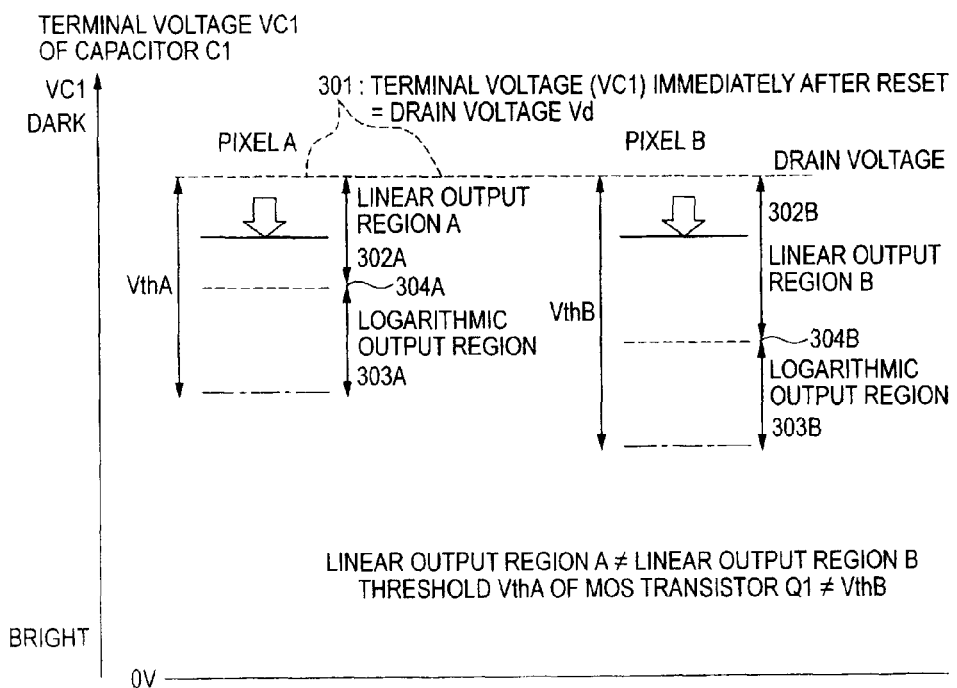
FIG. 26 is a diagram illustrating problems of the image sensor formed by prior art optical sensor circuits having linear and logarithmic output characteristics.

With respect to the settings and advantages of the above-described voltages V1, V2 shown in FIGS. 14 and 16, description will be added with reference to FIGS. 19 and 20.

FIG. 19 is a timing waveform chart showing only the above-described voltages V1, V2. In FIG. 19, the setting period of the low voltage value of the voltage V2 when the voltage V1 has a high voltage value is requested to ensure the time period required for charging and discharging in the photodiode PD. The timings of rising of the voltage V1 and falling of the voltage V2 are arbitrarily set. Examples 1 to 3 of the timings are shown in FIG. 20.

When the voltage V2 is set to have a low voltage value, the gate of a logarithmic converting transistor is in an open state, and charges of the photodiode PD are charged and discharged. When the voltage V2 is set to have a high voltage value, the potential of the photodiode PD rapidly rises to a voltage which depends on the transistor threshold voltage.

FIG. 19 shows a period T between rising of the voltage V2 and falling of the voltage V1. When a state where the sub-threshold current starts to flow is attained, a photodiode potential corresponding to the threshold of the transistor in each pixel is obtained. Therefore, it is sufficient to set the period T to the order of micro seconds. When the period T is shortened, it is possible to quickly transfer to a linear output operation after resetting of the photodiode. Therefore, the integration time can be prolonged, and hence a high sensitivity is attained in low-illuminance exposure.

The above description of the embodiments have been conducted while assuming the MOS transistor is of the n-channel type. It is matter of course that, in place of the transistor, a p-channel MOS transistor can be used.

The configuration, shape, size, and arrangement relationship which have been described in the above embodiments are schematically shown to a degree at which the invention can be understood and embodied, and numerals and compositions (materials) of configurations are mere exemplifications. Therefore, the invention is not restricted to the illustrated embodiments, and can be variously modified without departing the technical concept shown in the claims.

The application is based on Japanese Patent Application (No. 2005-170936) filed Jun. 10, 2005, and its disclosure is incorporated herein by reference.

INDUSTRIAL APPLICABILITY

The invention is used as an optical sensor circuit (or a pixel) forming a one-dimensional or two-dimensional image sensor of a MOS image sensor which is an imaging apparatus.

The invention claimed is:

1. An optical sensor circuit comprising:
a photoelectrical converting device which includes an electrostatic capacitance element that stores charges, and which converts a light signal to a current signal;
a converting MOS transistor for converting the current signal output from said photoelectrical converting device to a voltage signal having a logarithmic characteristic in a weak inversion state; and
controlling means for supplying a gate voltage to a gate of said MOS transistor, and supplying a drain voltage to a drain of said MOS transistor,
wherein said controlling means has initial setting means for performing initial setting in which said electrostatic capacitance element of said photoelectrical converting device is charged/discharged while setting the gate voltage of said converting MOS transistor to a high gate voltage value (VgH), only for a first predetermined time period, and setting the drain voltage to a low drain voltage value (VdL), only for a second predetermined time period, thereafter the drain voltage is set to a high drain voltage value (VdH), after elapse of a third predetermined time period, the gate voltage is set to a low gate voltage value (VgL), and wherein the high gate voltage value (VgH), the high drain voltage value (VdH), and the low drain voltage value (VdL) are set so as to satisfy relational expressions of
"VgH−VdH<Vth and VgH−VdL>Vth where Vth: a threshold voltage of said converting MOS transistor", and
wherein a potential difference (W) between a value obtained by subtracting the threshold voltage (Vth) of said converting MOS transistor from a low gate voltage value (VgL) and a terminal voltage (VC) of the photoelectric converting device is set to be high, and the initial setting is performed such that the set potential difference (W) is constant in plural optical sensor circuits.

2. The optical sensor circuit according to claim 1, wherein said controlling means has switching means for switchingly setting the high gate voltage value (VgH) of said converting MOS transistor to an arbitrary voltage value.

3. The optical sensor circuit according to claim 1, wherein said circuit comprises an amplifying MOS transistor for amplifying the voltage signal output from said converting MOS transistor.

4. The optical sensor circuit according to claim 3, wherein said circuit comprises an output-selecting MOS transistor for selectively outputting a voltage signal output from said amplifying MOS transistor.

5. The optical sensor circuit according to claim 4, wherein said circuit comprises:
- another electrostatic capacitance element which accumulates charges on the basis of the terminal voltage of said photoelectrical converting device; and
- a charge-moving MOS transistor for selectively moving charges between said electrostatic capacitance element and said other electrostatic capacitance element,
- said initial setting means
- turns on said charge-moving MOS transistor,
- sets the gate voltage of said converting MOS transistor to the high gate voltage value (VgH), only for the first predetermined time period, sets the drain voltage to the low drain voltage value (VdL), only for the second predetermined time period, charges/discharges the electrostatic capacitance element of said photoelectrical converting element and the other electrostatic capacitance element, thereafter sets the drain voltage to the high drain voltage value (VdH), and, after elapse of the third predetermined time period, sets the gate voltage to the low gate voltage value (VgL), and sets the high gate voltage value (VgH), the high drain voltage value (VdH), and the low drain voltage value (VdL) so as to satisfy the relational expressions,
- thereafter, after elapse of a constant exposure time, said charge-moving MOS transistor is turned off to set said other electrostatic capacitance element to an open state, and then said output-selecting MOS transistor is turned on so that a sensor signal is output.

6. An image sensor wherein an imaging region is formed by using an optical sensor circuit according to claim 1, as one pixel.

7. The optical sensor circuit according to claim 2, wherein said circuit comprises an amplifying MOS transistor for amplifying the voltage signal output from said converting MOS transistor.

8. The optical sensor circuit according to claim 7, wherein said circuit comprises an output-selecting MOS transistor for selectively outputting a voltage signal output from said amplifying MOS transistor.

9. The optical sensor circuit according to claim 8, wherein said circuit comprises:
- another electrostatic capacitance element which accumulates charges on the basis of the terminal voltage of said photoelectrical converting device; and
- a charge-moving MOS transistor for selectively moving charges between said electrostatic capacitance element and said other electrostatic capacitance element,
- said initial setting means turns on said charge-moving MOS transistor,
- sets the gate voltage of said converting MOS transistor to the high gate voltage value (VgH), only for the first predetermined time period, sets the drain voltage to the low drain voltage value (VdL), only for the second predetermined time period, charges/discharges the electrostatic capacitance element of said photoelectrical converting element and the other electrostatic capacitance element, thereafter sets the drain voltage to the high drain voltage value (VdH), and, after elapse of the third predetermined time period, sets the gate voltage to the low gate voltage value (VgL), and sets the high gate voltage value (VgH), the high drain voltage value (VdH), and the low drain voltage value (VdL) so as to satisfy the relational expressions,
- thereafter, after elapse of a constant exposure time, said charge-moving MOS transistor is turned off to set said other electrostatic capacitance element to an open state, and then said output-selecting MOS transistor is turned on so that a sensor signal is output.

\* \* \* \* \*